(12) United States Patent
Ge et al.

(10) Patent No.: US 10,917,112 B2
(45) Date of Patent: *Feb. 9, 2021

(54) APPARATUS AND METHODS FOR ERROR DETECTION CODING

(71) Applicants: Yiqun Ge, Kanata (CA); Ran Zhang, Kanata (CA); Nan Cheng, Kanata (CA); Wuxian Shi, Kanata (CA)

(72) Inventors: Yiqun Ge, Kanata (CA); Ran Zhang, Kanata (CA); Nan Cheng, Kanata (CA); Wuxian Shi, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/511,180

(22) Filed: Jul. 15, 2019

(65) Prior Publication Data

US 2020/0014401 A1    Jan. 9, 2020

Related U.S. Application Data

(63) Continuation of application No. 15/611,201, filed on Jun. 1, 2017, now Pat. No. 10,361,717.

(Continued)

(51) Int. Cl.
*H03M 13/09*     (2006.01)
*H03M 13/13*     (2006.01)
(Continued)

(52) U.S. Cl.
CPC ....... *H03M 13/091* (2013.01); *G06F 11/1479* (2013.01); *H03M 13/09* (2013.01);
(Continued)

(58) Field of Classification Search
CPC .................................................. H03M 13/091
(Continued)

(56) References Cited

U.S. PATENT DOCUMENTS 4,873,630 A    10/1989   Rusterholz
6,658,378 B1   12/2003   Maeda
(Continued)

FOREIGN PATENT DOCUMENTS

CN     101394222 A    3/2009
CN     101536387 A    9/2009
(Continued)

OTHER PUBLICATIONS

Ramtin Pedarsani, Polar Codes: Construction and Performance Analysis, Jun. 2011 (48 pages).
(Continued)

*Primary Examiner* — Fritz Alphonse

(57) ABSTRACT

A first error-detecting code (EDC) is computed based on a first segment of a block of information that is to be encoded, and a second EDC is computed based on at least a second segment of the block of information. The first EDC is masked with a first masking segment and the second EDC with a second masking segment to generate a first masked EDC and a second masked EDC. The first masking segment and the second masking segment are associated with a target receiver of the block of information. A codeword is generated based on a code and an input vector that includes the first segment, the first masked EDC, the second segment, and the second masked EDC. This type of coding could be useful to support early termination of blind detection at a decoder, for example.

21 Claims, 23 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \quad G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Related U.S. Application Data

(60) Provisional application No. 62/442,648, filed on Jan. 5, 2017, provisional application No. 62/351,460, filed on Jun. 17, 2016.

(51) Int. Cl.
*H04L 1/00* (2006.01)
*G06F 11/14* (2006.01)

(52) U.S. Cl.
CPC .......... *H03M 13/13* (2013.01); *H04L 1/0041* (2013.01); *H04L 1/0045* (2013.01); *H04L 1/0053* (2013.01); *H04L 1/0054* (2013.01); *H04L 1/0057* (2013.01); *H04L 1/0061* (2013.01)

(58) Field of Classification Search
USPC .......................................... 714/752, 757, 755
See application file for complete search history.

(56) References Cited

U.S. PATENT DOCUMENTS

| | | | |
|---|---|---|---|
| 9,417,754 | B2 | 8/2016 | Smith |
| 9,432,298 | B1 | 8/2016 | Smith |
| 2013/0148623 | A1 | 6/2013 | Nishio et al. |
| 2015/0229337 | A1* | 8/2015 | Alhussien ............ H03M 13/35 714/773 |
| 2016/0182187 | A1 | 6/2016 | Kim et al. |
| 2018/0048334 | A1* | 2/2018 | Sarkis .................. H04L 1/0057 |
| 2018/0097580 | A1 | 4/2018 | Zhang |
| 2018/0219561 | A1 | 8/2018 | Litsyn |
| 2018/0331693 | A1* | 11/2018 | Lou ...................... H03M 13/09 |

FOREIGN PATENT DOCUMENTS

| | | |
|---|---|---|
| CN | 102957494 A | 3/2013 |
| CN | 105227189 A | 1/2016 |
| CN | 105337696 A | 2/2016 |
| EP | 1487120 A2 | 12/2004 |
| KR | 20010007417 A | 1/2001 |
| WO | 2015026148 A1 | 2/2015 |

OTHER PUBLICATIONS

Ido Tal, Alexander Vardy, List of Decoding of Polar Codes, Proceedings of the 2011 IEEE International Symposium on Information Theory, May 31, 2012 (11 pages).

Jincheng Dia, Kai Niu, Zhongwei Si, Chao Dong, Jiaru Ling, Does Gaussian Approximation Work Well for the Long-Length Polar Code Construction?, Mar. 16, 2017 (12 Pages).

Kai Niu, Kai Chen, CRC-Aided Decoding of Polar Codes, IEEE Communications Letters, vol. 16, No. 10, Oct. 2012 (4 pages).

Edral Arikan, Channel polarization: A method for constructing capacity-achieving codes for symmetric binary-input memoryless channels, IEEE Trans. Inf. Theory, vol. 55, No. 7, Jul. 20, 2009 (23 pages).

Noam Presman, Ofer Shapira, Simon Litsyn, Polar Codes with Mixed-Kernels, 2011 IEEE Symposium on Information Theory (ISIT) Proceedings, 2011, (29 pages).

Noam Presman, Simon Litsyn, Recursive Descriptions of Polar Codes, Jun. 18, 2015 (60 pages).

Ryuhei Mori, Toshiyuki Tanaka, Channel Polarization on q-ary Discrete Memoryless Channels by Arbitrary Kernels, 2010 IEEE Symposium on Information Theory (ISIT) Proceedings, Jul. 21, 2010 (5 pages).

Ryuhei Mori, Toshiyuki Tanaka, Non-Binary Polar Codes using Reed-Solomon Codes and Algebraic Geometry Codes, 2010 IEEE Information Theory Workshop, Jul. 21, 2010 (5 pages).

Huayi Zhou et al.,"Segmented CRC-Aided SC List Polar Decoding",2016 IEEE 83rd Vehicular Technology Conference,total 5 pages.

R1-1704247 Huawei, HiSilicon,"Polar Coding Design for Control Channel",3GPP TSG RAN WG1 Meeting #88bis, Spokane, USA, Apr. 3-7, 2017,total 14 pages.

R1-1700090 Huawei, HiSilicon,"On latency, power consumption and implementation complexity for polar codes",3GPP TSG RAN WG1 Ad-Hoc Meeting,Spokane, USA, Jan. 16-20, 2017,total 10 pages.

* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

100

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

102

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

Successive Cancellation Decoding for $i = 0, 1, \ldots, n-1$ do
   if $\hat{u}_i$ *is frozen* then set $\hat{u}_i$ accordingly;
   else
     if $W_i(\mathbf{y}_0^{n-1}, \hat{u}_0^{i-1}|0) > W_i(\mathbf{y}_0^{n-1}, \hat{u}_0^{i-1}|1)$ then
       set $\hat{u}_i \leftarrow 0$;
     else
       set $\hat{u}_i \leftarrow 1$;

$F = \{0, 1, 2, 4\}$

From 0 till $N-1$ if $i \in F, \hat{u}_i = 0$
  if $i \in F^c$, $$\hat{u}_i = \begin{cases} 0, & \text{if } \dfrac{P(0 \mid \hat{u}_0^{i-1}, \bar{y})}{P(1 \mid \hat{u}_0^{i-1}, \bar{y})} > 1 \\ 1, & \text{otherwise} \end{cases}$$

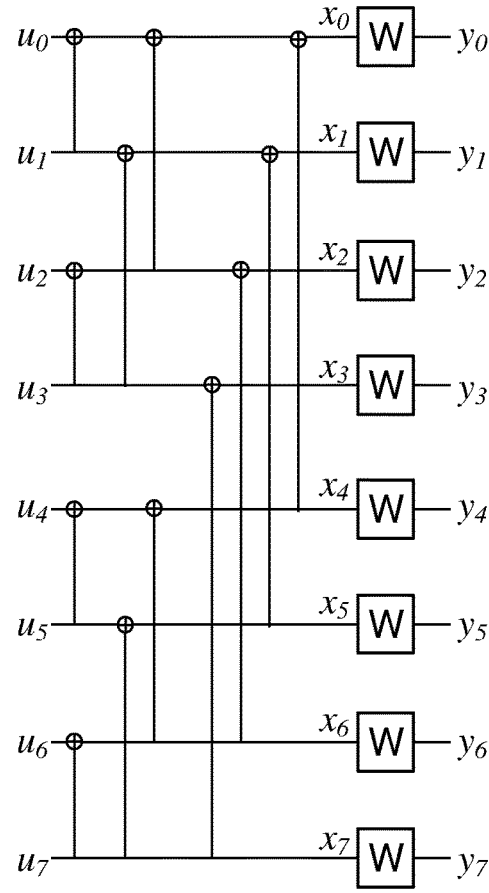

FIG. 3 ial Application No.
APPARATUS AND METHODS FOR ERROR DETECTION CODING

CROSS-REFERENCE TO RELATED APPLICATIONS

The present application is a continuation of U.S. application Ser. No. 15/611,201, entitled "Apparatus and Methods for Error Detection Coding", filed on Jun. 1, 2017, which claims the benefit of U.S. Provisional Application No. 62/351,460, entitled "Distributed Error Detection Codes for General Polar Coding", filed on Jun. 17, 2016 and U.S. Provisional Application No. 62/442,648, entitled "Apparatus and Methods for Error Detection Coding", filed on Jan. 5, 2017. All of these applications are incorporated in their entirety herein by reference.

FIELD

The present disclosure relates to generally to communications and, in particular, to error detection coding and general polar coding.

BACKGROUND

Error detection coding can be used to detect errors in decoding information that has been encoded using a code.

Polar codes, for example, are proposed as channel codes for use in future wireless communications, and have been selected for uplink and downlink eMBB control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extension SC List (SCL) decoding, are effective and efficient options for decoding polar coded information.

Based on channel polarization, Arikan designed a channel code that is proven to achieve the capacity of symmetric channels. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a synthesized channel with equivalently high Signal-to-Noise Ratio (SNR), and will have a relatively high reliability or a high likelihood of being correctly decoded, and bits encoded in low capacity sub-channels will have low reliability or a low possibility to be correctly decoded. The fraction of perfect bit-channels is equal to the capacity of a channel.

SUMMARY

Illustrative embodiments are disclosed herein by way of example.

According to one illustrative example embodiment, an apparatus includes an encoder to determine, calculate, or compute a first error-detecting code (EDC) based on a first segment of a block of information that is to be encoded and a second EDC based on at least a second segment of the block of information, and to mask the first EDC with a first masking segment and the second EDC with a second masking segment to generate a first masked EDC and a second masked EDC, and to generate a codeword based on a code and an input vector that includes the first segment, the first masked EDC, the second segment, and the second masked EDC. The first masking segment and the second masking segment are associated with a target receiver of the block of information. Such an apparatus may also include a transmitter, coupled to the encoder, to transmit the codeword.

A method according to another embodiment involves computing a first EDC based on a first segment of a block of information that is to be encoded and a second EDC based on at least a second segment of the block of information; masking the first EDC with a first masking segment and the second EDC with a second masking segment to generate a first masked EDC and a second masked EDC, the first masking segment and the second masking segment being associated with a target receiver of the block of information; generating a codeword based on a code and an input vector that includes the first segment, the first masked EDC, the second segment, and the second masked EDC; and transmitting the codeword.

A further embodiment relates to a non-transitory processor-readable medium storing instructions which, when executed by one or more processors, cause the one or more processors to perform such a method.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

FIG. 1 is a diagram showing one example of how a polar coding generator matrix can be produced from a kernel.

FIG. 3 illustrates an example of an SC (Successive Cancellation) decoding algorithm.

DETAILED DESCRIPTION

Polar codes are disclosed herein as an example of structured capacity-achieving channel codes. The error detection coding techniques as disclosed herein could be applied in conjunction with polar codes, for control channel coding in 5$^{th}$ Generation New Radio (NR), for example. Aspects of the present disclosure could be applied to types of codes other than polar codes, and/or to other types of communications than control channel communications.

In an embodiment, code length N of a polar code is power of 2. FIG. 1 is a diagram showing, by way of an illustrative example, how a polar coding generator matrix can be produced from a kernel $G_2$ 100. Note that FIG. 1 is an example. Other forms of kernels are also possible. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$, for code length $N=2^m$.

Figure 2:
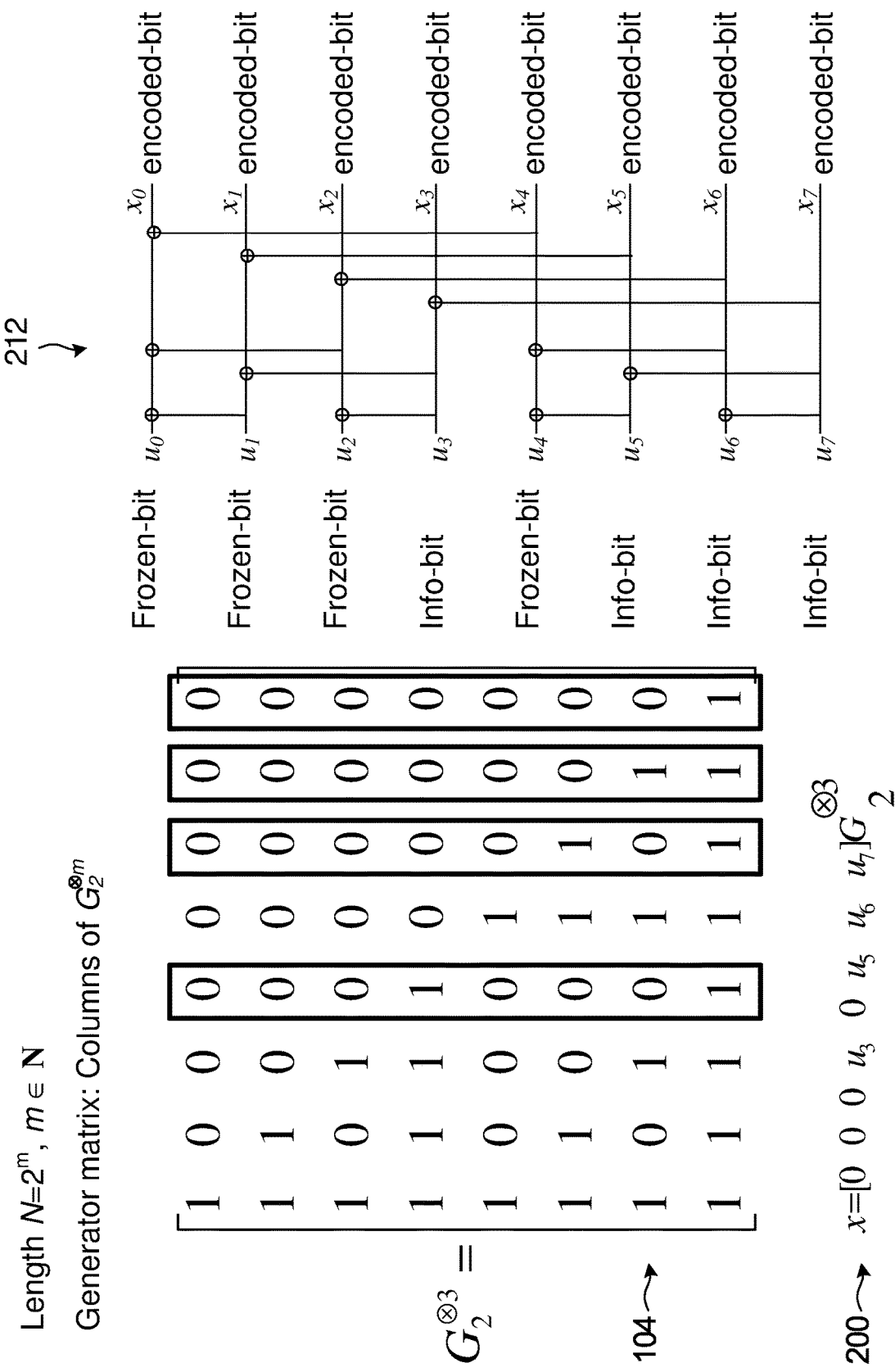
FIG. 2 is a diagram showing an example use of a polar coding generator matrix for producing codewords and a schematic illustration of an example polar encoder.

FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $N=2^3=8$. The codeword x is formed by the product of an input vector $u=[0\ 0\ 0\ u_3\ 0\ u_5\ u_6\ u_7]$ and the generator matrix $G_2^{\otimes 3}$ 104 as indicated at 200.

The input vector u is composed of information bits and fixed or frozen bits. In the specific example shown in FIG. 2, N=8, so the input vector u is an 8-bit vector, and the codeword x is an 8-bit vector. The input vector has frozen bits in positions 0, 1, 2 and 4, and has information bits at positions 3, 5, 6, and 7. An example implementation of an encoder that generates codewords is indicated at 212, where the frozen bits are all set to 0, and the circled "+" symbols represent modulo 2 addition. For the example of FIG. 2, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIG. 2. However, frozen bits could be set to other bit values that are known to both an encoder and a decoder. In theory, the frozen bits can be set to any value so long as the value and location of the frozen bits is known to both the encoder and the decoder. In conventional applications, the frozen bits are all set to zero. For ease of description, all-zero frozen bits are considered herein, and may be generally preferred.

As is known, polar coding may be performed with or without bit reversal. The example polar encoder in FIG. 2 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n\geq 1$. (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

A specific example of a polar code was described above in which the code is based on a generator matrix that is the m-fold Kronecker product of a specific kernel matrix $G_2$. The use of such a generator matrix results in polarization of sub-channels. When using successive cancellation (SC) decoding to decode codes of this form, some of the sub-channels will become noiseless channels, and some of the sub-channels will become totally noisy channels. The sub-channels are polarized. More generally, any generator matrix that produces a channel polarization effect will be referred to herein as a polar code generator matrix.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. A reliability sequence (reliable and unreliable positions) may be calculated based on assumed or measured characteristics of the physical channel before the information is transmitted over the channel.

With a sufficiently long code length, a code designed according to polarization theory can reach the channel capacity in a binary memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detection code (EDC) bits can be included in the input vector to assist in decoding. A cyclic redundancy check (CRC) code could be used as an EDC, for example. However, it should be understood that other EDCs, such as a checksum code or a Fletcher Code, may be used.

Some EDCs are also error-correcting codes (ECCs). For descriptive simplicity, some embodiments described herein use a CRC code as an illustrative example of an EDC. As disclosed in further detail herein, more than one EDC could be used within one codeword.

CRC bits, for example, are generated based on the information bits being transmitted. CRC bits are generally placed in the more reliable positions in the input vector, although CRC bits may also be placed in other positions in the input vector. CRC bits may be used in path selection for List decoding, for example, to improve polar code performance. During encoding, an N-bit input vector could be formed from K information bits, including one or more CRC bits, and (N−K) frozen bits. Starting with a number of input bits, a CRC is determined or calculated and appended to the input bits to produce a set of K information bits including the input bits and the CRC bits. The remaining (N−K) frozen bits are inserted to produce an N-bit input vector, where N is a power of 2 in an Arikan polar code. In the case of a polar code, the input vector is then multiplied by a generator matrix for a polar code to produce an N-bit codeword. This example includes the CRC bits among the K information bits. However, in other embodiments, CRC bits could be designated separately, such that an N-bit input vector could include K information bits, a u-bit CRC, and (N−K−u) frozen bits. This is simply a matter of notation. In embodiments disclosed herein, an input vector may include information bits, error detection coding bits, and frozen bits.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including the CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit. A bit that was set at step i cannot be changed at step j>i. In addition, knowledge of the value of subsequent frozen bits is not taken into account, i.e., subsequent frozen bits, even though known to the decoder, are not used to help decode the current unknown bit.

FIG. 3 illustrates an example of an SC decoding algorithm.

In Arikan, a successive-cancellation algorithm is described for decoding polar codes. Another type of polar decoding algorithm with better error correction performance, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. During generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to the decoded information bits is checked against the CRC bits represented in each of the surviving paths. The decoder then outputs as a decoded vector the information bits in the surviving path that passes the CRC check. If more than one path passes the CRC check, then the decoder selects to output the path that passes the CRC check and has the highest likelihood, which may be determined according to a metric. If no path passes the CRC check, or if the codeword does not include encoded CRC bits, then the decoder selects to output the path that has the highest likelihood, which as noted above may be determined according to a metric.

Thus, there are two types of the decoding based on successive cancellation, including SC decoding and List decoding, which is also referred to as SCL decoding. SC decoding is a special case of List decoding, with list size L=1. An SC decoder tracks only one decoding path. For every decoded bit, a decoding path generates 2 leaf branches (bit=0 or 1) for the next decoding bit. After the value of a decoded bit is estimated, the other possible value is ignored. Decoding continues with the next bit, assuming that each previous bit has been correctly estimated when updating partial sum results.

Computational complexity of a List decoder is directly determined by List size L. For successive cancellation in List decoding, the computational complexity is $O(L \cdot N \cdot \log 2(N))$. Computational complexity of the path metric updates in List decoding is $O(L \cdot (N-1))$, and computational complexity of path selection in List decoding is $R \cdot N \cdot O(2 \cdot L \cdot \log 2(2 \cdot L))$ when a quick-sorter is used in path selection. R is the coding rate, which is related to K and N as R=K/N. Implementation complexity of a List decoder is also determined by list size L. Implementation complexity for Log-Likelihood Ratio (LLR) memory is $O(L \cdot N)$, and implementation complexity for memory access is a function of L.

Reducing L, for a smaller list size in List decoding, reduces computational complexity and implementation complexity. However, for polar codes with a kernel shown in FIG. 1, a larger list size L is preferred for improved performance.

Although tracking multiple decoding paths as in SCL decoding may offer better decoding performance than single-path tracking as in SC decoders, multi-path decoder size and complexity increases with codeword length and with list size L. For example, for a codeword length N=8 with a 2-by-2 kernel, there are $2^8$=256 possibilities for estimated values $\hat{u}_0$ to $\hat{u}_7$. As codeword length increases, the number of possibilities grows exponentially, and tracking of all decoding paths for all combinations of $\hat{\mu}_x$ becomes impractical. By tracking multiple decoding paths according to a list of size L, SCL decoders may still offer better decoding performance than SC decoders, with reasonable size and complexity. An SCL decoder monitors the best L decoding paths and estimates information bit values for the L decoding paths by combining Log Likelihood Ratio (LLR) values with previously computed partial sum values.

Each decoding path from the root (decoded bit #0) of a decoding tree is associated with a Path Metric (PM). A decoding path appends each newly decoded bit to previous estimated values. After the LLR computations for each decoded bit, path metrics are continuously updated for each decoding bit (both frozen bits and information bits) using the LLR values as follows:

if the LLR value >=0
  PM[0, i+1]=PM[i]
  PM[1, i+1]=PM[i]+|LLR|
if the LLR value <0
  PM[0, i+1]=PM[i]+|LLR|
  PM[1, i+1]=PM[i].

The best decoding paths have the smallest PM values. If an LLR is less than 0, then the decoded bit is most likely a 1, so the next PM for the estimated value 1 (PM[1, i+1]) remains the same as the current path metric, and the absolute LLR value is added to the PM for the estimated value 0 (PM[0, i+1]), in effect "penalizing" the less likely path with the absolute LLR value. If the LLR value is near 0, then the decision for the value of $\hat{u}_x$ is unreliable and the PM penalty on the penalized path is small.

For every decoded bit in a decoding tree, each decoding path produces 2 new decoding paths for a 2-by-2 kernel in the example shown. Each "leaf" decoding path inherits the LLR, partial sum, and PM values from its parent. After the number of decoding paths reaches L, an SCL decoder selects, based on the 2L PMs for the 2L candidate decoding paths, the L paths with the lowest PMs, and drops the other L decoding paths. The selected L paths are sorted using the PMs. For example, path sorting could assign path identifiers (IDs) or indices to the selected paths, with the path having the best PM being assigned a path ID #1, a path with the worst PM being assigned path ID #L, and other paths being assigned path IDs #2 to #(L−1) in accordance with their PMs. New decoding path IDs could be assigned after each sort step, following estimation of each codeword bit.

Figure 4:
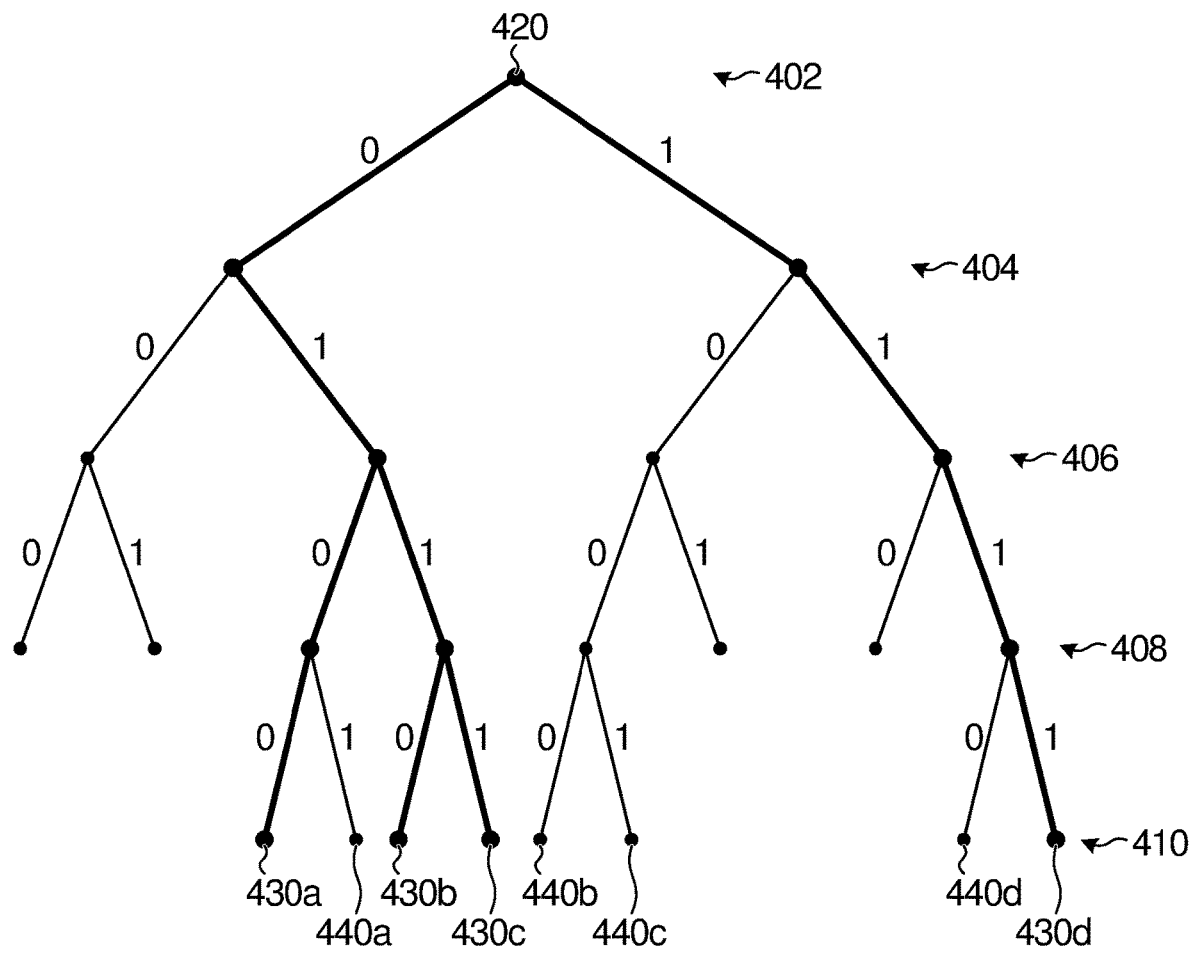
FIG. 4 is a diagram showing a portion of an example decision list tree whose width is limited by a maximum given list size and used in an SCL (Successive Cancellation List) polar decoder.

FIG. 4 is a diagram showing a portion of an example decision list tree used in an SCL polar decoder, whose width is limited by a maximum given list size L. In FIG. 4 the list size L is 4. Five levels 402, 404, 406, 408, 410 of the decision tree are illustrated. Although five levels are illustrated, it should be understood that a decision tree to decode N bits would have N+1 levels. At each level after the root level 402, each one of up to 4 surviving decoding paths is extended by one bit. The leaf or child nodes of root node 420 represent possible choices for a first bit, and subsequent leaf nodes represent possible choices for subsequent bits. The decoding path from the root node 420 to leaf node 430a, for example, represents an estimated codeword bit sequence: 0, 1, 0, 0. At level 408, the number of possible paths is greater than L, so L paths having the highest likelihood (e.g. best PMs) are identified, and the remaining paths are discarded. The decoding paths that survive after the path sort at level 406 are shown in bold in FIG. 4. Similarly, at level 410, the number of possible paths is again greater than L, so the L paths having the highest likelihood (e.g. best PMs) are identified, and the remaining paths are again discarded. In the example shown, the paths terminating in leaf nodes 430a, 430b, 430c, and 430d represent the highest likelihood paths. The paths terminating in leaf nodes 440a, 440b, 440c, 440d are the lower likelihood paths which are discarded.

SCL decoding can be further divided into (pure) list decoding in which survivor paths with the highest likelihood are selected and CRC-Aided SCL (CA-SCL) decoding where CRC bits are used for path selection (i.e. error correction) during decoding or after decoding all the bits. A CRC may provide better error correction performance in the final path selection, but is optional in SCL decoding. Other decoding-assistant operations such as a parity check based on parity or "PC" bits that are included in an input vector, could be used instead of or jointly with CRC in final path selection during decoding.

Pure SCL decoding, which does not use CRC or other error detection/correction codes for path pruning or selection, largely improves the performance of a polar code for a limited code length. However, compared with the similar code length and code rates of Low Density Parity Check (LDPC) codes and Turbo codes, pure SCL decoding may have a worse Block Error Rate (BLER) than well-designed LDPC and Turbo codes. CRC-aided SCL (CA-SCL) decoding may further improve the performance of a polar code with a limited code length. For example, a CA-SCL decoder with a list size L=32 could provide much better performance than LDPC and Turbo codes with similar computational complexity.

Figure 5:
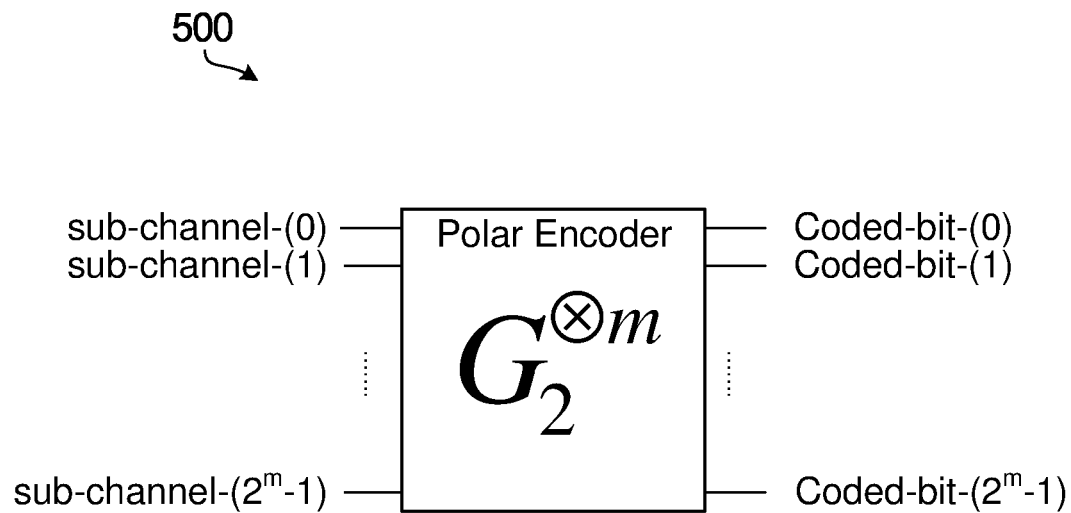
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 500 based on a 2-by-2 kernel. Sub-channels and coded bits are labeled in FIG. 5. A channel is divided into N sub-channels by a polar code as noted above. An information block and frozen bits are allocated onto the N sub-channels, and the resultant N-sized vector is multiplied with an N-by-N Kronecker matrix by the polar encoder 500 to generate a codeword that includes N coded bits. An information block includes at least information bits and could also include assistant bits such as CRC bits or PC bits. A sub-channel selector (not shown) could be coupled to the polar encoder 500 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over the sub-channels. Some sub-channels have high capacity, and some sub-channels have low capacity. Put another way, some sub-channels have equivalently high Signal-to-Noise Ratio (SNR) and others have low SNR. These metrics are examples of characteristics that could be used to quantify or classify sub-channel "reliability". Other metrics indicative of sub-channel reliability can also be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNRindependent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

Coding examples described above relate to binary encoding and decoding of information bits. A general polarization kernel and polar coding using generator matrices formed from such a kernel are also contemplated. For example, a Kronecker product could be used to form generator matrices from a general polarization kernel. A general polarization kernel operates on at least one non-binary input symbol and may be used in coding non-binary information symbols. An information symbol includes one or more bits, and in some embodiments disclosed herein at least one information symbol is a multi-bit symbol.

A general polarization kernel is an l-dimension kernel go) over alphabet F, and is polarized. The frame error rate of polar codes that use a polarized kernel with exponent E satisfies $P_e = o \, (2^{-N^\beta})$ for $\beta < E$. E is an upper bound in this example. The kernel $G_2$ 100 in FIG. 1, which is also expressed as (u+v, v), has an exponent E of 0.5. Kernels with a larger exponent E have a better frame error performance at the same block length. In other words, other forms of kernel that polarize faster may have better frame error performance.

Figure 6:
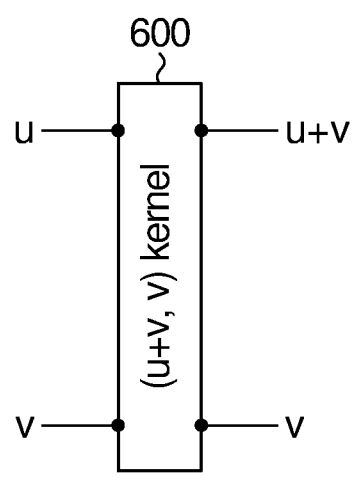
FIG. 6 is a block diagram of a binary encoder kernel.

FIG. 6 is a block diagram of an encoder kernel 600. An input vector with bits [u v] are multiplied by the kernel 600, which is also shown as $G_2$ 100 in FIG. 1, to generate an output vector with bits [(u+v) v].

Figure 7:
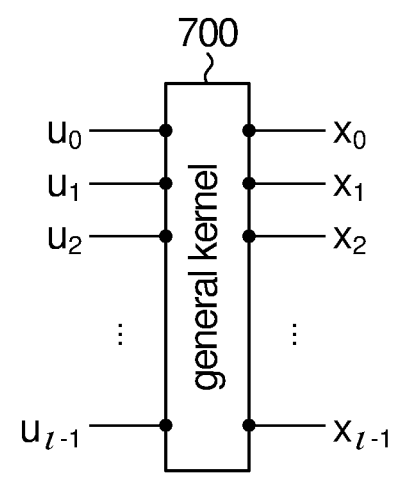
FIG. 7 is a block diagram of an example general polar encoder kernel.

FIG. 7 is a block diagram of an example general polar encoder kernel 700. The input vector is a vector of symbols $[u_0 \ldots u_{l-1}]$. The input vector includes at least one multi-bit symbol. A codeword with elements $[x_0 \ldots x_{l-1}]$ is generated by multiplying the input vector by the general polar encoder kernel 700. An example of a general polar encoder kernel is described in U.S. Provisional Patent Application No. 62/351,438, entitled "Systems and Methods for Piece-Wise Rate Matching When Using Polar Codes", filed on Jun. 17, 2016 and incorporated in its entirety herein by reference.

Figure 8:
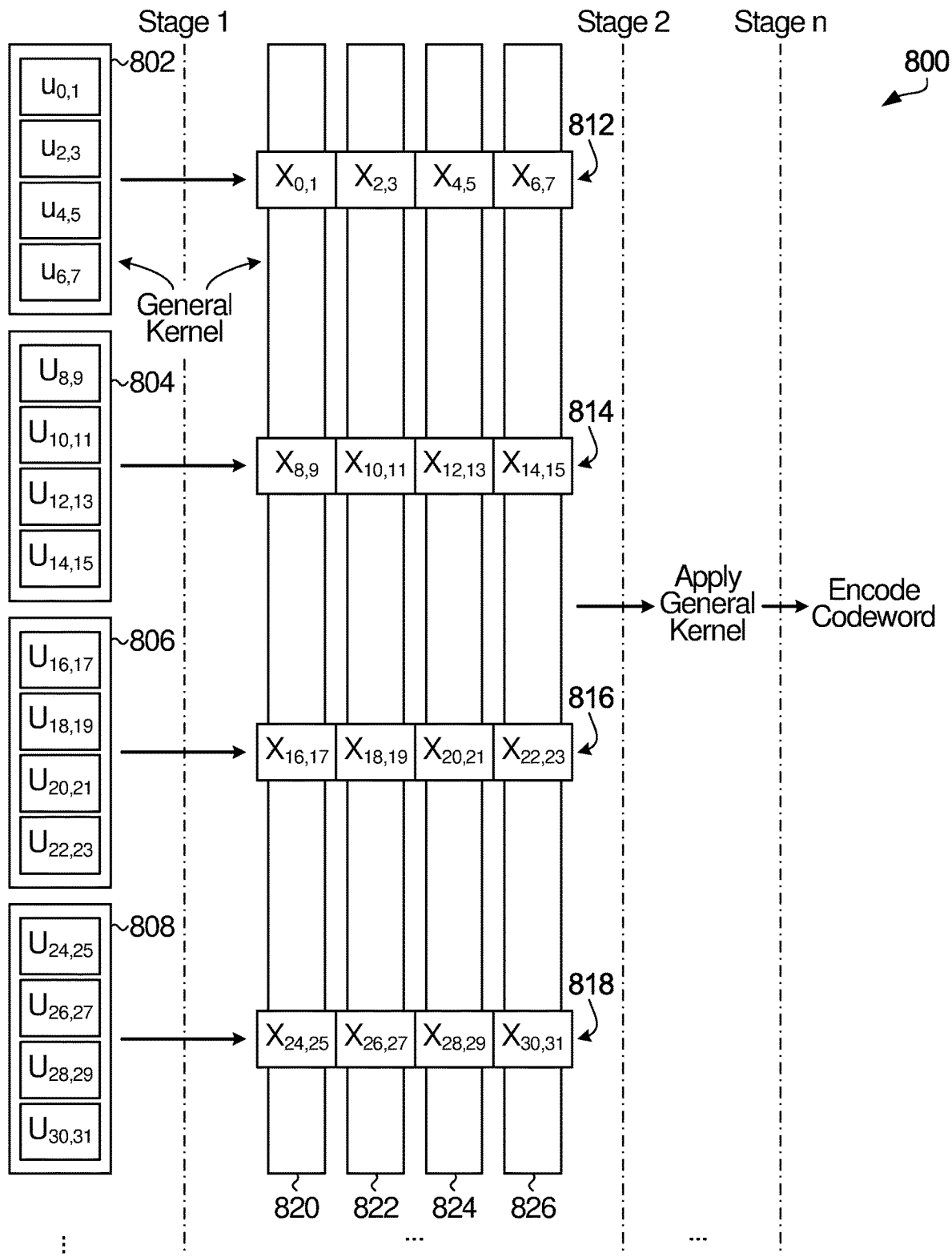
FIG. 8 is a block diagram illustrating an example recursive multi-layer general polar encoder.

FIG. 8 is a block diagram illustrating an example recursive multi-layer general polar encoder 800. An input vector of $N_{symbol} = l^n$ F-symbols $u_{0,1}, \ldots, u_{30,31}$ is to be encoded. In an embodiment, the input symbol set is an |F|-ary alphabet, which could be a quaternary alphabet for example. The input symbol notation $u_{0,1}, \ldots, u_{30,31}$ is intended to represent two-bit symbols in the example shown. In other embodiments, input symbols could have different lengths, and an input vector u for general polar coding could include both binary and non-binary input symbols.

The elements 802, 804, 806, 808 represent encoder elements that multiply input symbols by a general polar encoder kernel. Outputs from the stage 1 elements 802, 804, 806, 808 are shown at 812, 814, 816, 818. The elements 820, 822, 824, 826 represent encoder elements that multiply the stage 1 outputs 812, 814, 816, 818 by the general polar encoder kernel, to implement recursive multi-layer general polar encoding. Matrix multiplication by the encoder elements 802, 804, 806, 808, 820, 822, 824, 826 could be implemented using hardware such as matrix multipliers, or a combination of adders and multipliers, firmware, and/or a processing element such as a microprocessor that executes software. Electronic devices that might be suitable for implementing matrix multiplication include, among others, microprocessors, microcontrollers, Programmable Logic Devices (PLDs), Field Programmable Gate Arrays (FPGAs), Application Specific Integrated Circuits (ASICs), and other types of "intelligent" integrated circuits. Software could be stored in memory for execution. The memory could include one or more physical memory devices, including any of various types of solid-state memory devices and/or memory devices with movable or even removable storage media.

Although only 2 stages or layers of encoding are shown in FIG. 8, this type of recursive encoding may be applied in n stages to obtain the encoded codeword for block length l" symbols.

Figure 9:
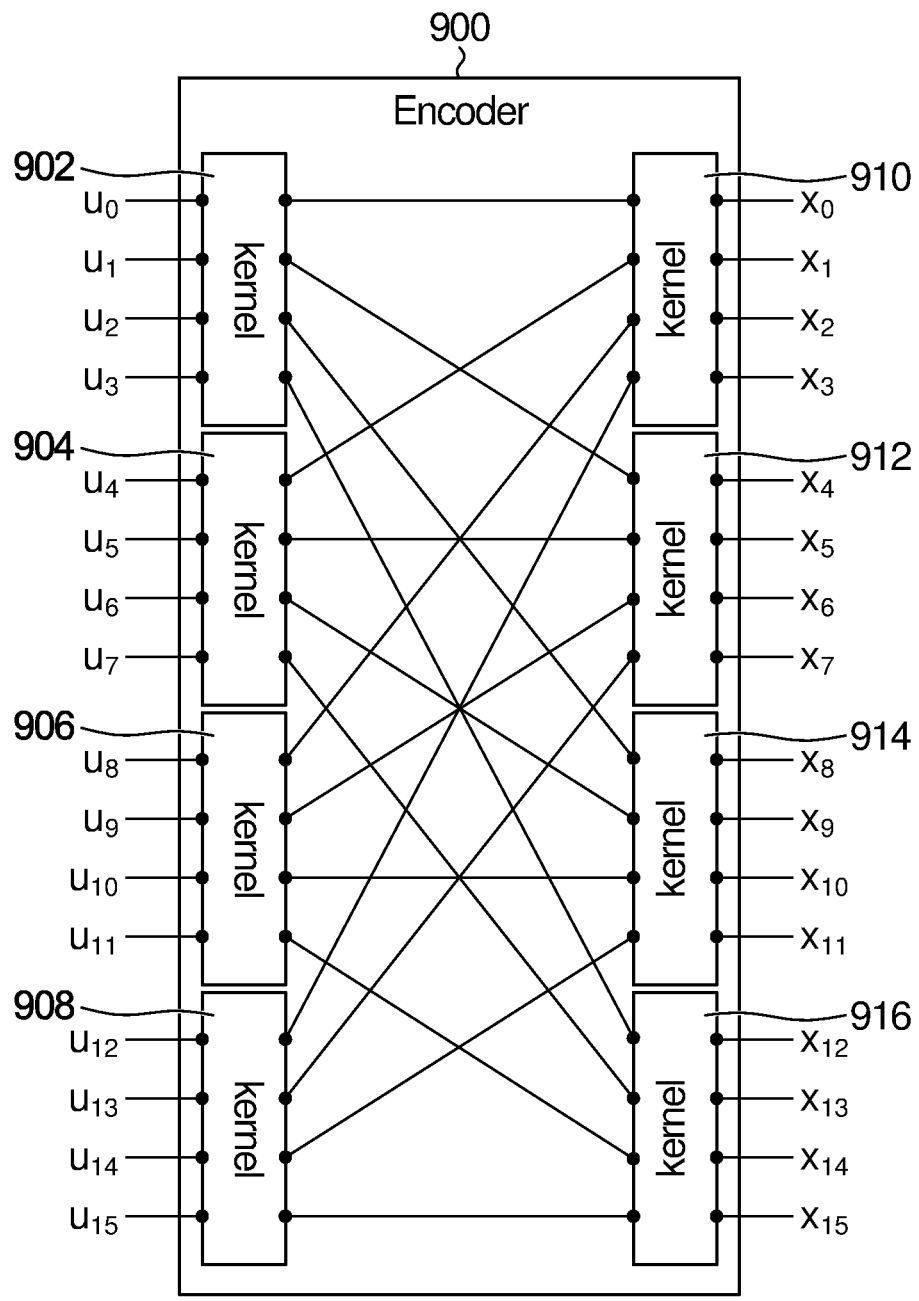
FIG. 9 is a block diagram illustrating another example recursive multi-layer general polar encoder.

FIG. 9 is a block diagram illustrating another example recursive multi-layer general polar encoder 900. In this example, l=4, $N_{symbol} = 16$, and there are 2 layers of kernels (n=2). The elements 902, 904, 906, 908, 910, 912, 914, 916 multiply symbols by a general polar encoder kernel. Example implementations of matrix multiplication are described above.

Figure 10:
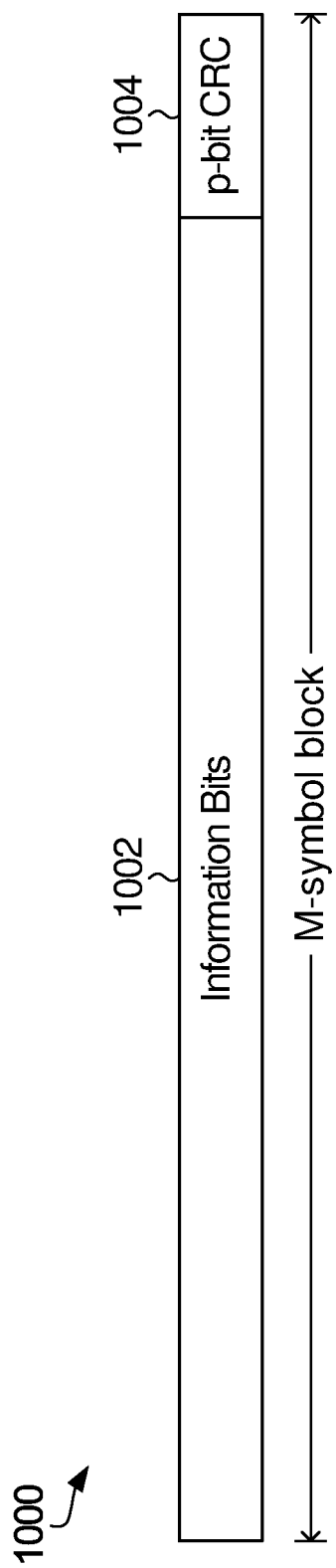
FIG. 10 is a block diagram illustrating a block of information bits with a CRC code.

List decoding, described above in the context of binary polar coding, could also be applied to a general polar coding. For CRC-assisted List decoding, a CRC is conventionally appended at the end of an information block that is to be encoded. A CA-SCL decoder performs a redundancy check to select the most probable decoded sequence by checking decoded CRC bits, but only after all of the bits in an entire codeword have been decoded. FIG. 10 is a block diagram illustrating a block 1000 of information bits 1002 protected by a p-bit CRC code 1004.

When errors are detected, a negative acknowledgement (NACK) is sent in a hybrid automatic repeat request (HARQ) scheme for packet re-transmission, for example. The HARQ scheme is not necessarily limited to List decoding, and could also affect decoders that apply Turbo decoding with Low Density Parity Check (LDPC) codes.

Conventional CRC appendance to the end of an information block makes it necessary for the decoder to decode an entire block before being able to detect errors, which may introduce unaccepted long latency. A method according to an embodiment disclosed herein could be an alternative for CRC allocation, which may reduce the latency of detecting errors.

Figure 11:
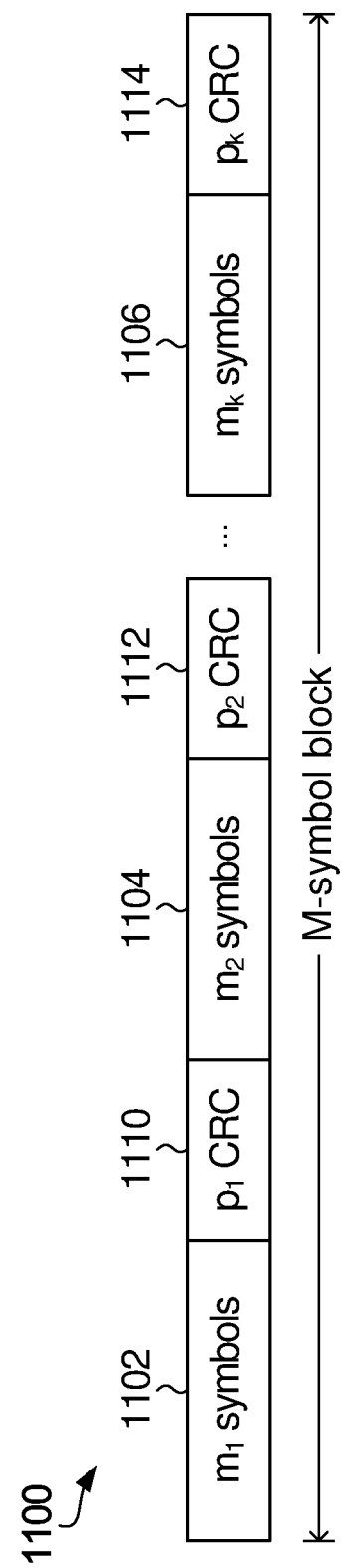
FIG. 11 is a block diagram illustrating blocks of information symbols with distributed CRC codes according to an embodiment.

FIG. 11 is a block diagram illustrating blocks of information symbols protected by distributed CRC codes according to an embodiment. An information symbol may include one or more bits, and therefore embodiments disclosed herein could be applied to bits, multi-bit symbols, or a combination of single-bit and multi-bit symbols. As shown, CRC codes 1110, 1112, 1114 are distributed in different locations of the block 1100, instead of only at the end. The $p_1$-bit CRC code 1110 is determined or calculated based on the group of $m_1$ symbols 1102. The $p_2$-bit CRC code 1112 is determined or calculated based on at least the group of $m_2$ symbols 1104, which follow the $m_1$ symbols 1102 in the original sequence of information symbols to be encoded, and so on. Subsequent CRC codes 1114 are similarly determined or calculated based on at least the immediately preceding $m_k$ information symbols 1106.

A CRC code after the first CRC code 1110 could be determined or calculated based on only the immediately preceding $m_k$ information symbols, or could instead be determined or calculated based on additional preceding information symbols and CRC codes. For example, the $p_2$-bit CRC code 1112 could be determined or calculated based on the $m_1$ information symbols 1102, the $p_1$-bit CRC code 1110, and the $m_2$ information symbols 1106.

In an embodiment, $p_1+p_2+\ldots p_k$ (FIG. 11)=p (FIG. 10), and the total length of the block 1100 is the same as the total length of the block 1000. In other embodiments, the total length of the CRC codes 1110, 1112, 1114 is different from p.

If decoding of a received codeword fails, a NACK should be sent as early as possible. It is contemplated that a long block length may be used in order to achieve high throughput. In the CRC scheme shown in FIG. 10, the CRC is verified after a whole packet is decoded. If the CRC fails and the packet is re-transmitted, an entire decoding cycle has already been performed and must be repeated for the re-transmitted packet. This introduces decoding latency.

In a distributed CRC scheme represented in FIG. 11, at any time a CRC fails, a re-transmission can be requested. In this way, the decoding latency due to packet error can be reduced.

Also, with distributed CRC codes, different list sizes can be applied to List decoding of different sections of a codeword. According to non-uniform reliability distribution of polar codes, a larger list or lists could be used for sections at the beginning of codewords, and a smaller list or lists could be used for later sections of codewords.

Figure 12:
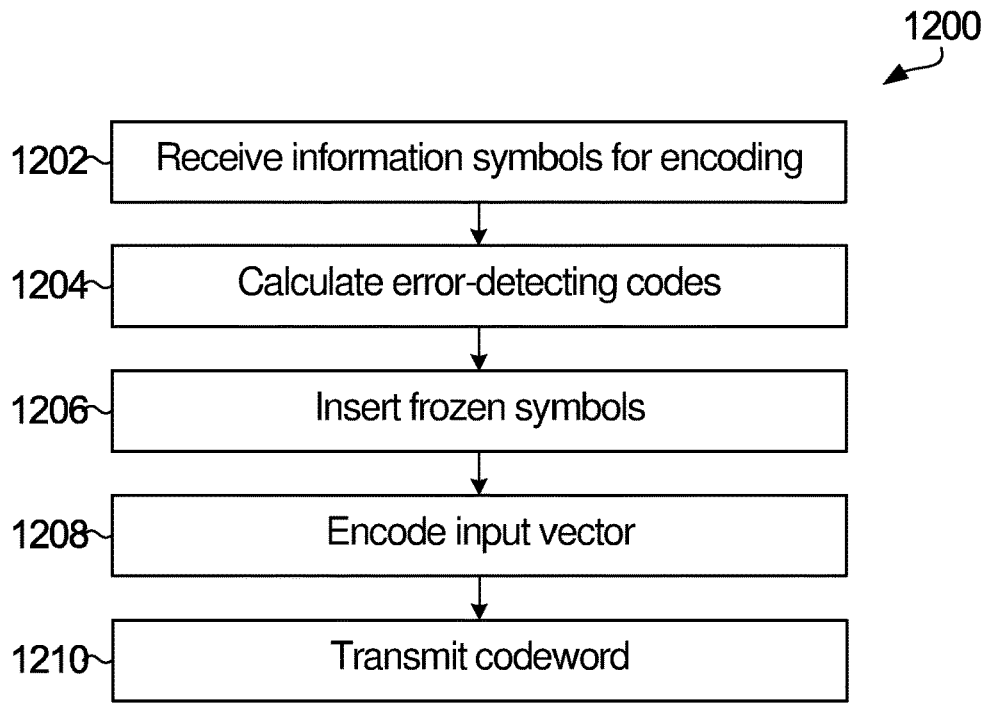
FIG. 12 is a flow diagram of an example method according to an embodiment.

FIG. 12 is a flow diagram of an example method 1200 for encoding and transmission according to an embodiment. The method 1200 involves an encoder receiving a block of information symbols that are to be encoded, at 1202. At least one of the information symbols is a multi-bit symbol. At 1204, error-detecting codes (EDCs) are determined or calculated. This involves determining or calculating at least a first EDC based on a first group of information symbols, and determining or calculating a second EDC based on at least a second group of information symbols that follow the first group of information symbols in the information block. This is shown by way of example in FIG. 11. This could be repeated for each of one or more groups of information symbols that follow the second group of information symbols in the information block.

In some embodiments, frozen symbols are inserted at 1206. An input vector is formed from the information symbols, the EDCs distributed between the groups of information symbols, and any frozen symbols that are inserted at 1206. The input vector is encoded at 1208. A codeword is generated based on a generator matrix for a polar code and the input vector, for example by performing a symbol-level multiplication of the input vector by the generator matrix. The codeword is transmitted at 1210.

The example method 1200 is intended for illustrative purposes. Other embodiments could involve performing the illustrated operations in any of various ways, performing fewer or additional operations, and/or varying the order in which operations are performed.

For example, determining or calculating the second EDC could involve determining or calculating the second EDC based on the first group of information symbols, the first EDC, and the second group of information symbols.

Groups of information symbols could have the same or different lengths. The EDCs could also have the same or different lengths. The numbers of symbols in each information symbol group and/or the length(s) of the EDCs could be fixed and known by receivers, or variable and signalled to receivers. A method could involve also transmitting information that is indicative of any one or more of: $m_1$, $m_2$, $p_1$, and $p_2$, or more generally information indicative of information signal group sizes, information signal group locations, EDC sizes, and/or EDC locations.

Other variations could be or become apparent to a skilled person based on the present disclosure.

More generally, the example method 1200 is illustrative of a method that involves determining or calculating a first EDC based on a first group of information symbols in a block of information symbols that are to be encoded, with the information symbols including at least one multi-bit information symbol; determining or calculating a second EDC based on at least a second group of information symbols that follow the first group of information symbols in the information block; generating a codeword based on a generator matrix for a polar code and an input vector that includes the first group of information symbols, the first EDC, the second group of information symbols, and the second EDC; and transmitting the codeword.

Any one or more of the following could be provided, alone or in any of various combinations, in embodiments:

determining or calculating the second EDC involves determining or calculating the second EDC based on the first group of information symbols, the first EDC, and the second group of information symbols;

the first group of information symbols includes $m_1$ symbols, the second group of information symbols includes $m_2$ symbols, and $m_1$ is different from $m_2$;

the first EDC includes $p_1$ bits, the second EDC includes $p_2$ bits, and $p_1$ is different from $p_2$;

the first EDC and the second EDC are CRC codes, checksum codes, or Fletcher Codes;

inserting at least one frozen symbol into the input vector;

for each of at least one group of information symbols that follow the second group of information symbols in the information block: determining or calculating a further EDC based on at least a further group of information symbols that follow the second group of information symbols in the information block; wherein the input vector includes the first group of information symbols, the first EDC, the second group of information symbols, the second EDC, the further group of information symbols, and the further EDC;

transmitting information indicative of any one or more of: a number of information symbols in the first group of information symbols, a number of information symbols in the second group of information symbols, a length of the first EDC, and a length of the second EDC.

Figure 13:
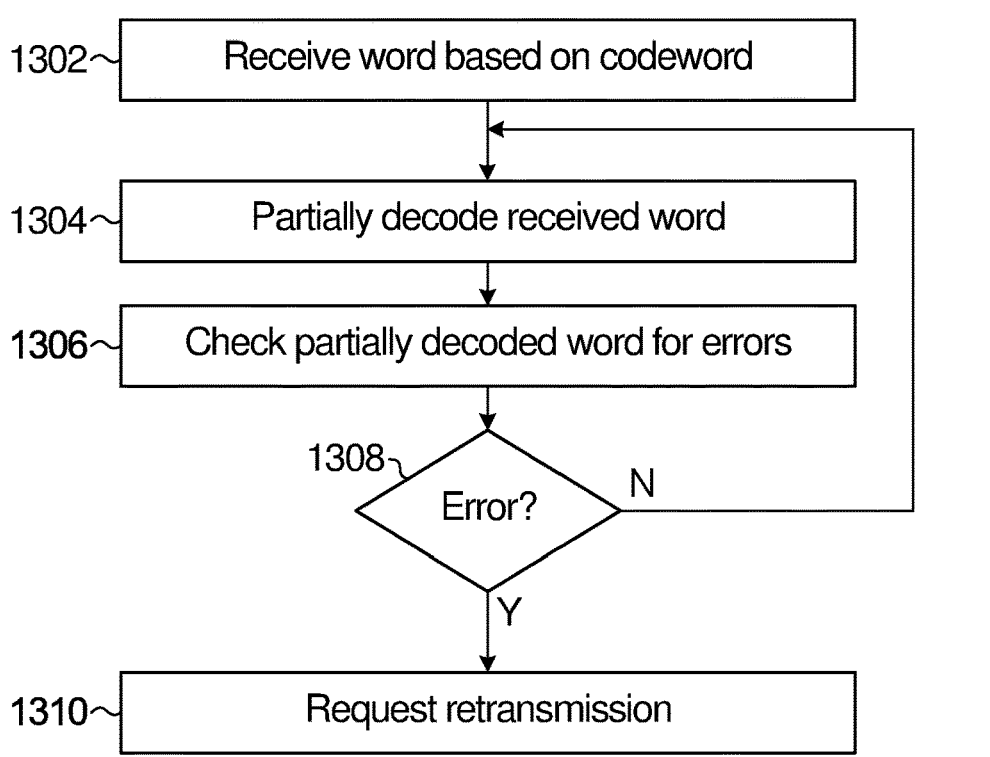
FIG. 13 is a flow diagram of an example method according to another embodiment.

FIG. 13 is a flow diagram of an example method according to another embodiment. The example method in FIG. 13 relates to reception and decoding. These operations could be performed at either or both of user equipment (UE) and network equipment in a communication network.

The method 1300 involves receiving a word at 1302. The received word is based on a codeword that was generated based on a generator matrix for a polar code and an input vector that includes groups of information symbols in a block of information symbols and EDCs that protect at least the respective groups of information symbols. In an embodiment, there are $m_1$ information symbols, a $p_1$-bit EDC protecting the $m_1$ information symbols, $m_2$ information symbols, and a $p_2$-bit EDC protecting the $m_2$ information symbols.

The received word is partially decoded at 1304. This involves decoding a first group of information symbols and its EDC from the received word. The partially decoded word is checked for errors at 1306, using the decoded EDC. If no errors are detected in the partially decoded word, then a next group of information symbols and its EDC are decoded from the received word at 1304 and checked for errors at 1306. These operations are repeated until the entire received word is decoded or an error is detected at 1308. The action(s)

taken when an error is detected is application-specific. In some embodiments, retransmission is requested at 1310 after an error is detected. In other embodiments, retransmission might not be requested. Errors could be correctable when an ECC is used, for example.

The example method 1300 is intended for illustrative purposes. Other embodiments could involve performing the illustrated operations in any of various ways, performing fewer or additional operations, and/or varying the order in which operations are performed. Some variations regarding the codeword are noted above with reference to FIG. 12.

In FIG. 13, the decoding at 1304 could involve List decoding. Different list sizes could be used for decoding different groups of information symbols and their corresponding EDCs. Other variations could be or become apparent based on the present disclosure.

More generally, the example method 1300 is illustrative of a method that involves receiving a word that is based on a codeword. The codeword is a codeword that was generated based on a generator matrix for a polar code and an input vector that includes a first group of information symbols in a block of information symbols, a first EDC that protects the first group of information symbols, a second group of information symbols that follow the first group of information symbols in the information block, and a second EDC that protects at least the second group of information symbols. Such a method may also involve decoding the first group of information symbols and the first EDC from the received word; checking the decoded first group of information symbols for errors using the decoded first EDC; and decoding the second group of information symbols and the second EDC from the received word if no errors are detected in the decoded first group of information symbols.

Any one or more of the following could be provided, alone or in any of various combinations, in embodiments:

the first EDC and the second EDC are CRC codes, checksum codes, or Fletcher Codes;

the decoding comprises List decoding;

the List decoding comprises using different list sizes for decoding the first group of information symbols and the second group of information symbols.

FIGS. 1 to 13 and the description above provide general information regarding polar codes, as an example of codes in conjunction with which error detection coding and distributed error detection coding could be used. As noted above, polar codes have been selected for uplink and downlink NR control channel coding in eMBB scenario. This selection is believed to be primarily because a CA-SCL decoder of polar codes exhibits better block error rate (BLER) than other channel codes such as convolutional code (CC), tail-biting convolutional code (TBCC), Turbo code (TC), and Low Density Parity Check (LDPC) codes with similar complexity.

In some implementations, the information block size of a control channel is usually less than 200 bits and code rates are lower than ½. SCL decoding shows a constant coding gain for such code lengths and code rates.

A wireless communication system typically defines different channels over which to transmit data between wireless equipment, such as between a communication network node and User Equipment (UE) or other wireless communication devices. Different types of channels carry different types of data. For example, a data channel carries user data, and a control channel carries control data. The control data supports transmission of the user data over the data channel. One important feature about a control channel is blind detection, in which a receiver detects whether there is information transmitted for that receiver at a given physical resource or in a pool of physical resources.

As an example, consider a Physical Downlink Control Channel (PDCCH) in a system that is or evolves from Long Term Evolution (LTE). A PDCCH is a physical channel that carries control data called Downlink Control Information (DCI). This DCI among other things supports transmission of user data over the Physical Downlink Shared Channel (PDSCH). The DCI in this regard informs a UE about the location of physical resource block pairs that are allocated to it in the PDSCH, the modulation scheme that the UE needs to use for recovering its user data on the PDSCH, as well as the related information for PDSCH Hybrid Automatic Repeat Request (HARQ).

Figure 14:
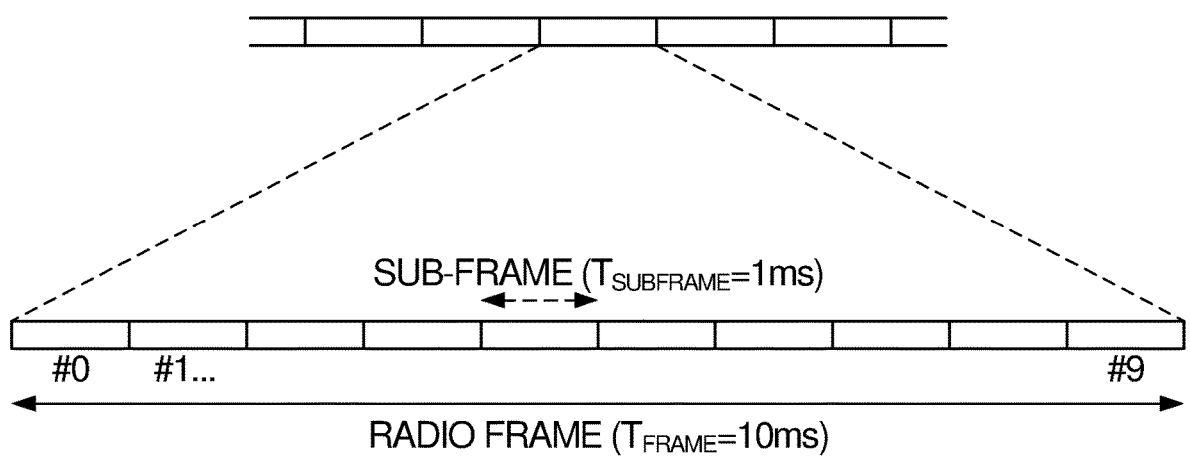
FIG. 14 is a block diagram illustrating an example Long Term Evolution (LTE) radio frame.

FIG. 14 is a block diagram illustrating an example LTE radio frame. As shown in FIG. 14, in the time domain, LTE downlink transmissions are organized into radio frames of 10 ms, with each radio frame consisting of ten equally-sized subframes of length $T_{subframe}$=1 ms. FIG. 14 and the following discussion thereof are provided as just an example. Frame structure and frame/subframe timing may be different in other embodiments, depending on the implementation.

Resource allocation in LTE is typically described in terms of resource blocks (RBs). An RB corresponds to one slot (0.5 ms) in the time domain and 12 contiguous subcarriers in the frequency domain. A pair of two adjacent RBs in time (1.0 ms) is known as an RB pair. RBs are numbered in the frequency domain, starting with 0 from one end of the system bandwidth.

In some implementations (e.g. grant-based implementations), downlink transmissions are dynamically scheduled. In each subframe, a base station transmits control data in the form of DCI indicating to which UEs data is transmitted over the PDSCH and upon which RBs the data is transmitted, in the current downlink subframe. The DCI could include, for example, downlink scheduling assignments in the form of PDSCH resource indications, transport format, Hybrid Automatic Repeat Request (HARQ) information, and control information related to spatial multiplexing (if applicable). The DCI could also include a command for power control of the physical uplink control channel (PUCCH) used for transmission of HARQ acknowledgements in response to downlink scheduling assignments. The DCI could further include uplink scheduling grants and power-control commands. The different types of control information correspond to different DCI message sizes, categorized into different DCI formats.

A DCI message may be transmitted over the PDCCH in the first 1, 2, or 3 Orthogonal Frequency Division Multiplexing (OFDM) symbols in each subframe under certain conditions (for example, for bandwidths that accommodate more than ten resource blocks), or over the first 2, 3, or 4 OFDM symbols in each subframe under other conditions (for example, for bandwidths that accommodate less than ten resource blocks). The region over which the PDCCH extends is designated as the control region. The number of symbols (1, 2, 3 or 4) is known as the Control Format Indicator (CFI).

One PDCCH carries one DCI message with one of the different possible DCI formats. A CRC is attached to each DCI message payload in a way that enables blind decoding or detection of the DCI by UEs. The identity of the target UE (or UEs) addressed, i.e., the Radio Network Temporary Identifier (RNTI), is masked over the attached CRC bits. Upon reception of DCI, a UE will first de-mask the decoded CRC bits using its set of assigned RNTIs, then check the decoded DCI message bits using the de-masked CRC. If the CRC passes, then the message is declared to be correctly received and intended for the UE. Thus, the identity of the UE to which a DCI message is addressed is implicitly encoded in the CRC and not explicitly transmitted. This reduces the number of bits necessary to transmit on the PDCCH.

As multiple UEs can be scheduled simultaneously, requiring multiple DCI messages within each subframe, each DCI message is transmitted on a separate PDCCH. Consequently, there are typically multiple simultaneous PDCCH transmissions conveying multiple different DCI messages. Since a UE does not know in advance the precise location of the DCI message(s) intended for it in a subframe, the UE relies on blind detection, where the UE searches the potential candidate locations of the subframe where its DCI message(s), if any, may have been transmitted.

To allow for simple yet efficient processing of PDCCH in the UE, the mapping of PDCCHs to Resource Elements (REs) is subject to a certain structure. This structure is based on so-called Control Channel Elements (CCEs), which, in essence, is a convenient name for a set of 36 REs (or nine resource-element groups or REGs). The number of continuous CCEs, one, two, four, or eight, used for a certain PDCCH depends on the payload size of the control data (DCI payload) and the channel-coding rate. This number of CCEs is referred to as the aggregation level. As the number of CCEs for each of the PDCCHs may vary and is not signaled, the UE has to blindly determine the number of CCEs used for the PDCCH it is addressed upon. To reduce the complexity of this process somewhat, certain restrictions on the aggregation level of contiguous CCEs have been specified and define search spaces that the UE's search is constrained to. A search space is therefore a set of candidate PDCCHs formed by CCEs on a given aggregation level, which the UE is to attempt to decode.

As there are multiple aggregation levels, corresponding to one, two, four, and eight CCEs, a UE has multiple search spaces. In each subframe, a UE will attempt to decode all the PDCCHs that can be formed from the CCEs in each of its search spaces. If the CRC passes, then the content of the PDCCH is declared as valid for the UE and the UE processes the DCI. In some embodiments, the control data is transmitted using one or more symbols over a number of CCEs in a control region, defining a PDCCH within that control region. In other embodiments, the control data is transmitted within a user data region, using one or more symbols over a number of enhanced CCEs (eCCEs) defining an enhanced PDCCH (ePDCCH) within that user data region.

To send control data to a UE, a network node generates a DCI payload for a UE. The network node proceeds to generate and attach a corresponding CRC to the DCI payload based on (for example, scrambled with) an RNTI associated with the UE. The node channel codes the DCI payload (including the CRC) for example, using a polar encoder and modulates the encoded bits into symbols for transmission to the intended UE. The UE attempts to perform a blind detection to recover its control data from received symbols using demodulation, for example using Quadrature Phase Shift Keying (QPSK) demodulation, to obtain demodulated bits. The UE then channel decodes the demodulated bits (e.g. using a polar decoder) to obtain the DCI and its corresponding CRC. If a CRC check of the DCI using the UE's RNTI(s) is not successful, then the UE determines that the DCI is not intended for it, ignores the DCI, and repeats demodulating and channel decoding for a new candidate PDCCH. If, on the other hand, the CRC check is successful, the UE determines that the DCI is intended for it.

Blind detection as used in LTE allows a receiver, which is a UE in the case of PDCCH, to determine whether there is a PDCCH that is intended for the receiver at a current Transmit Time Interval (TTI). The basic blind detection mechanism in LTE system is based on CCEs as noted above, and a (pre-determined) allocation scheme or pattern that is known to both a transmitter and a targeted receiver, but may vary with different subframes. These CCEs together form a candidate pool for a PDCCH search.

Figure 15:
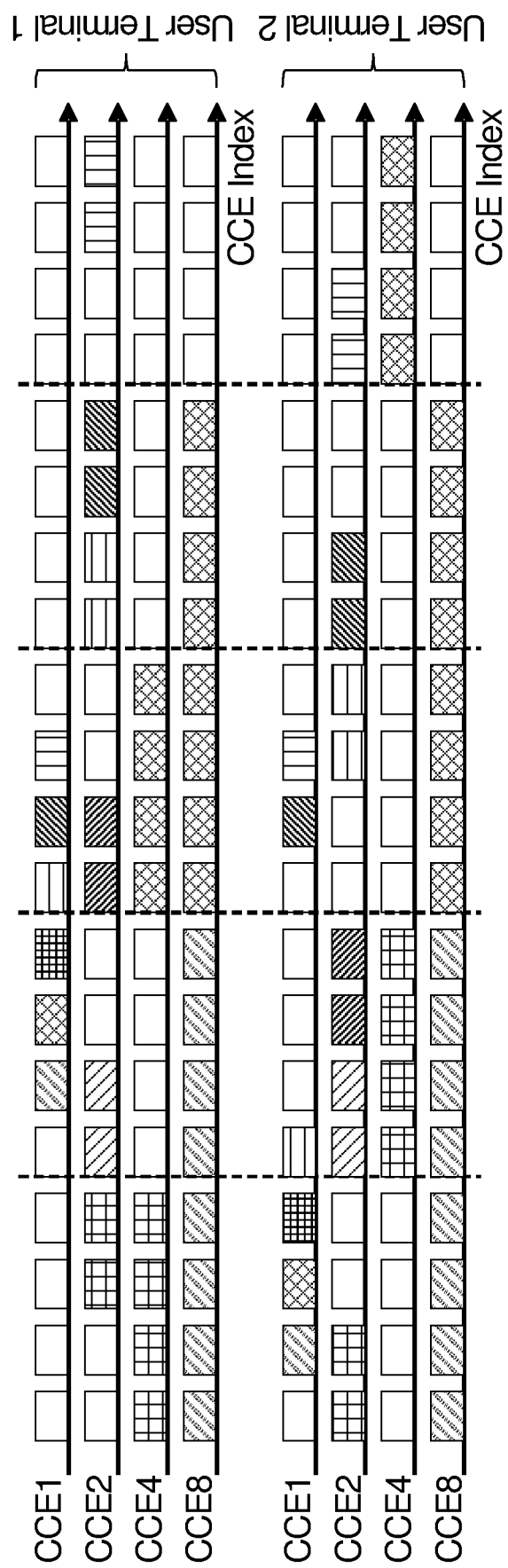
FIG. 15 is a block diagram illustrating an example pattern of Control Channel Elements (CCEs).

FIG. 15 is a block diagram illustrating an example pattern of CCEs. The four aggregation levels noted above are labelled as CCE1, CCE2, CCE4, and CCE8 in FIG. 15. CCE1, for example, denotes a search space for aggregation level 1, consisting of 6 candidate PDCCH locations. The other CCE labels in FIG. 15 similarly denote search spaces for other aggregation levels.

In LTE, the search space is a function of aggregation level. If the aggregation level in LTE can be as high as 8, the maximum search space is 16 candidates for a UE-specific search and 6 candidates for common search. For each candidate search location, at most two possible sizes of DCI messages are used. Therefore, one UE may conduct blind detection at most 44 times for one TTI PDCCH search.

In NR, for supporting a higher throughput, a larger aggregation level or different number of aggregation levels could be used. Therefore, depending on how aggregation is structured in NR, there could be a much larger search space to address.

Figure 16:
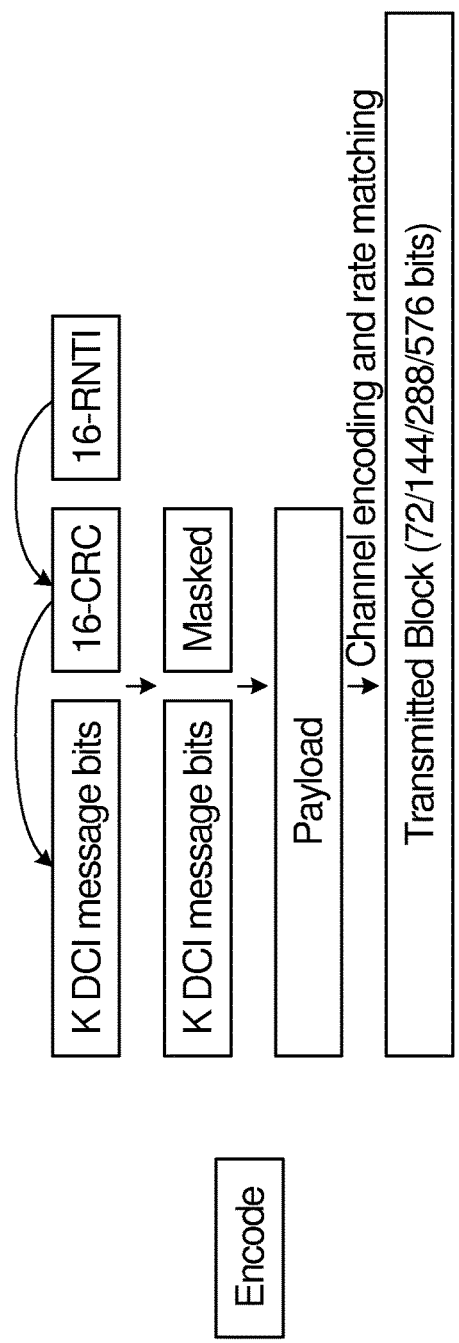
FIG. 16 Is a block diagram illustrating Physical Downlink Control Channel (PDCCH) masked error detection encoding in LTE.

FIG. 16 is a block diagram illustrating PDCCH masked error detection encoding in LTE. As shown, a 16-bit Code Block (CB) level CRC is determined or calculated based on K DCI message bits, and an RNTI (16-bit UE ID) is scrambled or masked onto the CRC bits, to enable blind detection by a decoder at a target UE. The encoder typically used in current LTE systems is a Tail-biting Convolutional Code (TBCC) encoder.

Figure 17:
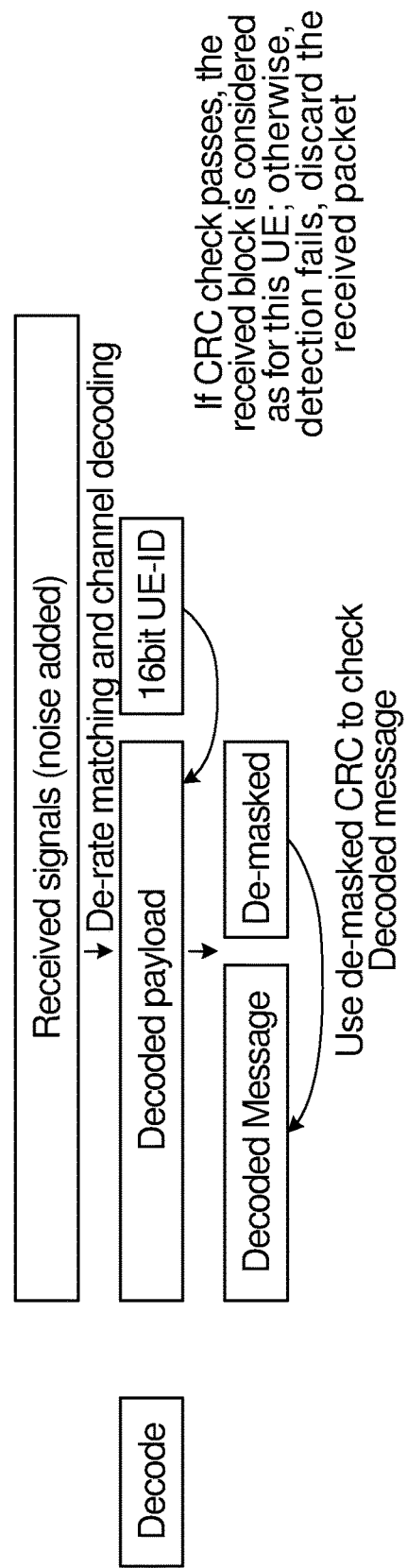
FIG. 17 is a block diagram illustrating LTE PDCCH blind detection by masked error detection decoding.

The CB-level CRC allows a TBCC decoder to firstly decode an entire information block and CRC bits in a CB and then check this information block with de-masked CRC bits. This is shown in FIG. 17, which is a block diagram illustrating PDCCH blind detection in LTE with masked error detection decoding.

Instead of using a TBCC encoding/decoding scheme, polar codes could be implemented for the PDCCH. For example, as noted above, polar codes have been selected for uplink and downlink NR control channel coding, With polar coded PDCCH data, an SCL decoding algorithm could then provide better coding performance with similar blind detection based on masked CRC bits and a similar false-alarm rate.

However, one potential issue related to PDCCH blind detection is relatively high average power consumption at the UE side. As a UE does not know in advance whether there is a PDCCH intended for it at a current TTI, a UE always attempts blind detection. Unfortunately, a complete CB has to be decoded before a detection decision can be made based on the CRC check result. If there is no PDCCH for the UE, then the UE would decode CBs for all of the candidates during a search. It is expected that decoding for blind detection could account for a significant amount, such as about 70%~80%, of power consumption when a UE is in an idle mode.

Early decoding termination is widely used in LTE data channels to reduce average power consumption. Consider an example of an LTE data channel with a Turbo decoder. Because such a decoder is an iterative decoder, a CRC check could be performed after each iteration. Once a CRC check is passed, the decoding procedure can be terminated early, before a maximum number of iterations is reached. In practice, most communications under good channel conditions would result in an early termination before reaching the maximum number of iterations, so that average power consumption is reduced and energy is saved. In LTE, a 24-bit CRC is allocated for each CB in order to support efficient early termination.

However, for iterative decoders such as those used with convolutional codes, turbo codes, and LDPC codes, there is currently no early "failure" termination, especially during blind detection. The reason for this is that for iterative codes, an early termination is valid only with successful decoding (CRC is passed). With such channel codes, it is not possible to detect a decoding failure using a CRC before a maximum number of iterations reached or an entire code block is decoded.

According to embodiments disclosed herein, decoding is sequential and as such is "non-iterative", as in SC-based decoding such as SC or SCL decoding of polar codes, and error detection is possible before a full CB has been decoded. SC and SCL decoding involve non-recursive (e.g. non-iterative) decoding of one bit at a time, in sequence, and "non-return" decoding in which a decoded bit is not changed after it has been decoded. These properties of polar codes and SC or SCL decoding are exploited to provide for early termination decoding, for blind control channel detection for example, responsive to detection of a decoding failure. Although successful decoding early termination of other channel decoding schemes may be possible, early termination of SC or SCL decoding is based on early detection of a decoding error or decoding failure.

Early detection of a decoding error or decoding failure is provided by distributing error detection codes in a code block. Multiple CRCs, for example, could be determined or computed based on different parts of a code block and distributed in the code block to enable a decoder to run CRC checks during decoding, and before the full code block is decoded. The different parts of the code block need not necessarily be exclusive. For example, a first code block segment that is used to determine or compute a first error detection code could also be part of a larger second code block segment that is used to determine or compute a second error detection code.

Figure 18:
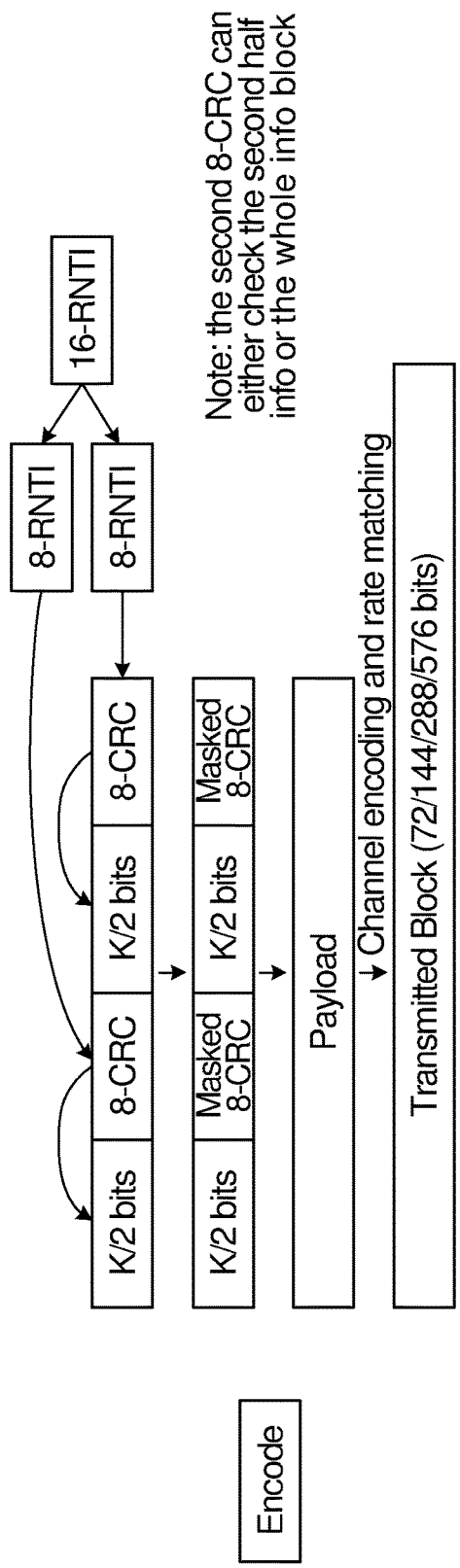
FIG. 18 is a block diagram illustrating an example of distributed masked error detection encoding.

FIG. 18 is a block diagram illustrating an example of distributed masked error detection encoding. In this example, both CB-level CRC bits and mask bits are split into parts or segments, the CRC bit segments are masked with the mask bit segments, and the masked CRC bit segments are distributed in the CB. In the example shown, one masked CRC bit segment is inserted into the middle of the CB, and the other is inserted at the end of the CRC.

The present disclosure refers to "splitting" of CRC bits solely for ease of reference. It should be appreciated that such splitting of CRC bits does not refer to first determining or computing a CB-level CRC and then splitting those determined or computed CRC bits for distribution in a CB. It is the total number of CB-level CRC bits, and not actual determined or computed CRC bit values, that are split for distribution. In the example shown in FIG. 18, one 16-bit CRC "split" into two 8-bit CRCs in the sense that the multiple 8-bit CRCs can be carried in the same length of CB as a 16-bit CB-level CRC, without requiring a longer CB. The 16-bit space occupied by a 16-bit CB-level CRC, and not a 16-bit CB-level CRC value, is split between multiple 8-bit CRCs in this example. The 8-bit CRCs are determined or computed separately, based on the K/2 bit segments in the example shown. This is also referenced herein as distributed error detection coding, with reference to FIG. 11 for example.

The 16-bit RNTI, however, could be split into two 8-bit RNTIs that include different bits of the 16-bit RNTI. One of the 8-bit RNTIs could be the first eight bits of the 16-bit RNTI, and the other 8-bit RNTI could be the last eight bits of the 16-bit RNTI, for example. RNTI splitting, or more generally UE ID splitting, could therefore involve splitting bit values of a larger UE ID into multiple smaller UE ID segments.

As shown in FIG. 18, a first 8-bit CRC is masked with the first 8-bit UE ID and put into the middle of the CB, and a second 8-bit CRC is masked with the first 8-bit UE ID and put at the end of the CB. CRC scrambling or masking could involve a bit-level XOR between each 8-bit CRC and a corresponding 8-bit RNTI, for example.

In some embodiments, such split and masked CRC encoding may not change the performance of a polar code, the false-alarm rate, or the missing detection rate.

Figure 19:
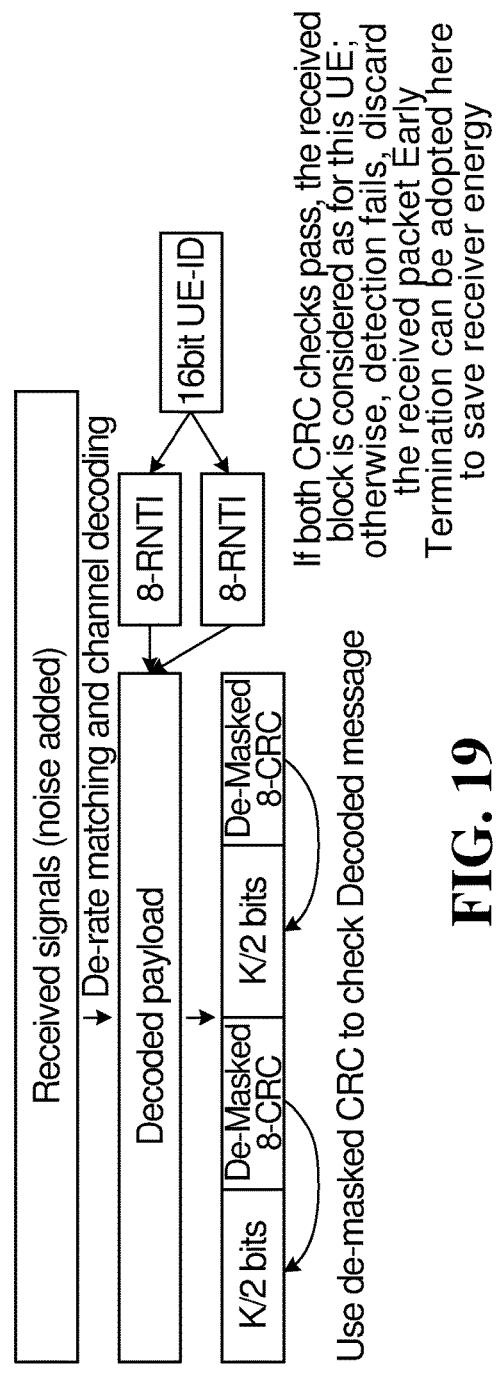
FIG. 19 is a block diagram illustrating an example of distributed masked error detection decoding.

Split and masked CRC encoding as shown by way of example in FIG. 18 enables early termination of decoding by an SC-based (SC or SCL) decoder, at the first 8-bit CRC in the case of a decoding error. FIG. 19 is a block diagram illustrating an example of distributed masked error detection decoding. The example of decoding for blind detection with early termination as shown in FIG. 19 matches the encoding example in FIG. 18.

Due to the non-recursive nature of SC-based decoding of polar codes, a CRC check can be performed when just the first half (K/2 bits) of the CB and the first 8-bit CRC have been decoded. If the CRC check for the first half does not pass, then the received block can be discarded, i.e. early terminated. Otherwise, decoding of a next segment of the code block (the second half, K/2 bits in this example) proceeds, to decode the full block. Decoding is not restarted from the beginning of the code block, and a received word is not demodulated or otherwise processed again before decoding proceeds after a CRC pass. In the case of SCL decoding, a CRC passes if any one path passes, and the CRC fails if all paths fail.

If a large percentage of false-alarm cases are eliminated at the first 8-bit CRC in this example, then the average power consumption can be significantly reduced.

Early termination could also be applied to CRC checking of at least CRCs that are located before the end of a CB, in the sense that CRC checking could be early terminated on detection of a CRC pass for any one path during SCL decoding. As noted above, in the case of SCL decoding, a CRC passes if any one path passes, and therefore CRC checking need not continue for additional paths after any path passes.

FIGS. 18 and 19 relate to just one illustrative example of distributed masked CRCs. Variations are possible.

For example, although in the example a 16-bit CRC is equally split into two 8-bit CRCs, a block-level CRC could be "split" into CRCs that are of different lengths. More generally, two or more distributed EDCs could be used, and such distributed EDCs could have the same length or include EDCs of different lengths.

A UE ID such as an RNTI could similarly be split into two or more masking segments to mask respective EDCs. Masking segments could be of the same length or different lengths. Each masking segment has a length corresponding to a length of the EDC that it is to mask, in an embodiment. A masking segment could be shorter than the EDC that it is to mask, and could be extended by padding for example to match the length of the EDC. Partial masking could instead be used to partially mask an EDC using a masking segment that is shorter than the EDC. A full-length masking segment having the same length as the EDC that it is to mask may have the best error detection and early termination performance, however, and may therefore be preferred.

A CRC is an example of an EDC. In other embodiments, different types of EDCs such as a checksum code or a Fletcher Code could be used.

In some embodiments, different IDs associated with a receiver UE can be used to mask respective EDCs of a CB intended for that UE. Alternatively, shorter receiver ID segments (secondary IDs) could be generated (as masking segments) based on a function of a larger ID that is associated with the intended receiver (a primary ID) such as a UE RNTI. One example is that secondary IDs are generated by "splitting" a primary ID as shown in FIGS. 18 and 19. It is understood however that generally, any method or function for generating the secondary IDs based on a function of a primary ID associated with the intended receiver can be used. In that scenario, the secondary IDs also become associated with the receiver.

An RNTI or other receiver ID is an example of an identifier or value that could be split or otherwise used to generate masking segments to mask distributed error detection codes. A masking segment need not necessarily be specific to a receiver. For example, a masking segment that includes only part of an RNTI could be common to more than one UE. However, a set of masking segments that together include an entire RNTI could, together, be specific to a UE.

UE-specific or receiver-specific masking is an illustrative example of masking that is associated with a receiver. Masking segments could, but need not necessarily always be, unique or specific to a receiver. For example, a UE could be associated with multiple RNTIs, some of which might be UE-specific and some not (e.g., RNTIs which are common to multiple UEs). Common RNTIs may be used to send data concurrently to multiple UEs, for instance. References herein to masking or masking segments being associated with receivers should be interpreted accordingly.

In some embodiments, distributed EDCs and masking segments that are shorter than block-level EDCs may be preferred for each segment of a code block, illustratively a control information segment such as a DCI segment, because the resulting EDC for each segment would be too long to be carried without extending the length of a code block, thereby impacting the system's performance. Using smaller EDCs for each code block segment, and using smaller masking segments, may provide for better performance.

A further variation of the examples shown in FIGS. 18 and 19 involves how code block segments are generated. In the examples shown, the K/2-bit segments are generated by equally splitting input bits such as DCI bits. CB segments need not be of equal length, and/or could be split into more than two segments. Splitting of input bits is also just an example of how segments of information could be generated. Different segments could be separately generated, as different sets of DCI for example, instead of being split from a single block of input bits.

The CRCs in FIGS. 18 and 19 are shown as providing error detection for respective code block segments. As noted in FIG. 19, however, the second 8-bit CRC could actually provide error detection for either the second K/2-bit segment or the entire content of the code block preceding the second CRC. More generally, if more than 2 code block segments are used, any given CRC could provide error detection for either the previous code block segment, or any combination of previous code block segments. Other possibilities exist for the CRCs.

As noted above, polar codes have a property that as code length increases to infinity, bit-channels (also referred to as sub-channels) polarize and their capacities approach either zero (completely noisy channel) or one (completely perfect channel). In encoding, input bits are assigned or allocated to sub-channels, and in general more reliable sub-channels are assigned or allocated to information bits, including input bits and CRC bits. Less reliable sub-channels are assigned or allocated to frozen bits.

Figure 20:
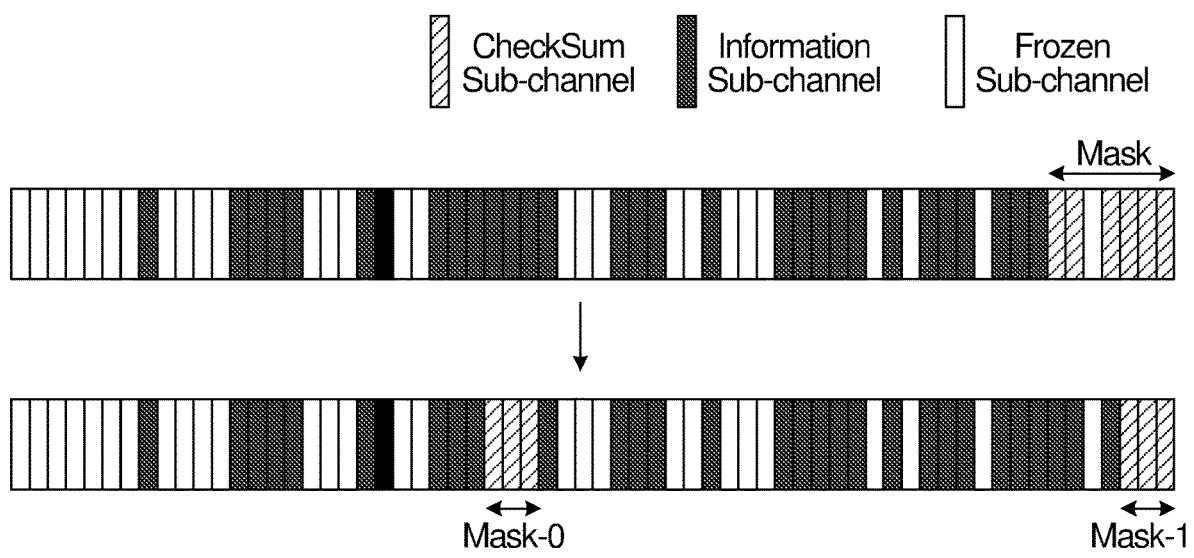
FIG. 20 is a block diagram illustrating different types of polar code sub-channels, including Cyclic Redundancy Check (CRC) sub-channels, information sub-channels, and frozen sub-channels.

FIG. 20 is a block diagram illustrating different types of polar code sub-channels, including CRC sub-channels that are assigned or allocated to CRC bits, information sub-channels that are assigned or allocated to input bits, and frozen sub-channels that are assigned or allocated to frozen bits. Input bits and CRC bits are referenced above as being information bits, but sub-channels for CRC bits are shown separately in FIG. 20 to more clearly illustrate example sub-channel assignments for CRC bits, or more generally EDC bits.

The upper sub-channels in FIG. 20 illustrate a sub-channel assignment in which CRC sub-channels are consecutive non-frozen sub-channels. The lower sub-channels in FIG. 20 illustrate a sub-channel assignment in which CRC sub-channels for CRC bits that are masked with the same mask segment (Mask-0 and Mask-1) are consecutive sub-channels. The different groups of consecutive sub-channels for differently masked CRC bits are distributed in the sub-channel space in the example shown. Other sub-channel assignments could be made in other embodiments.

Figure 21:
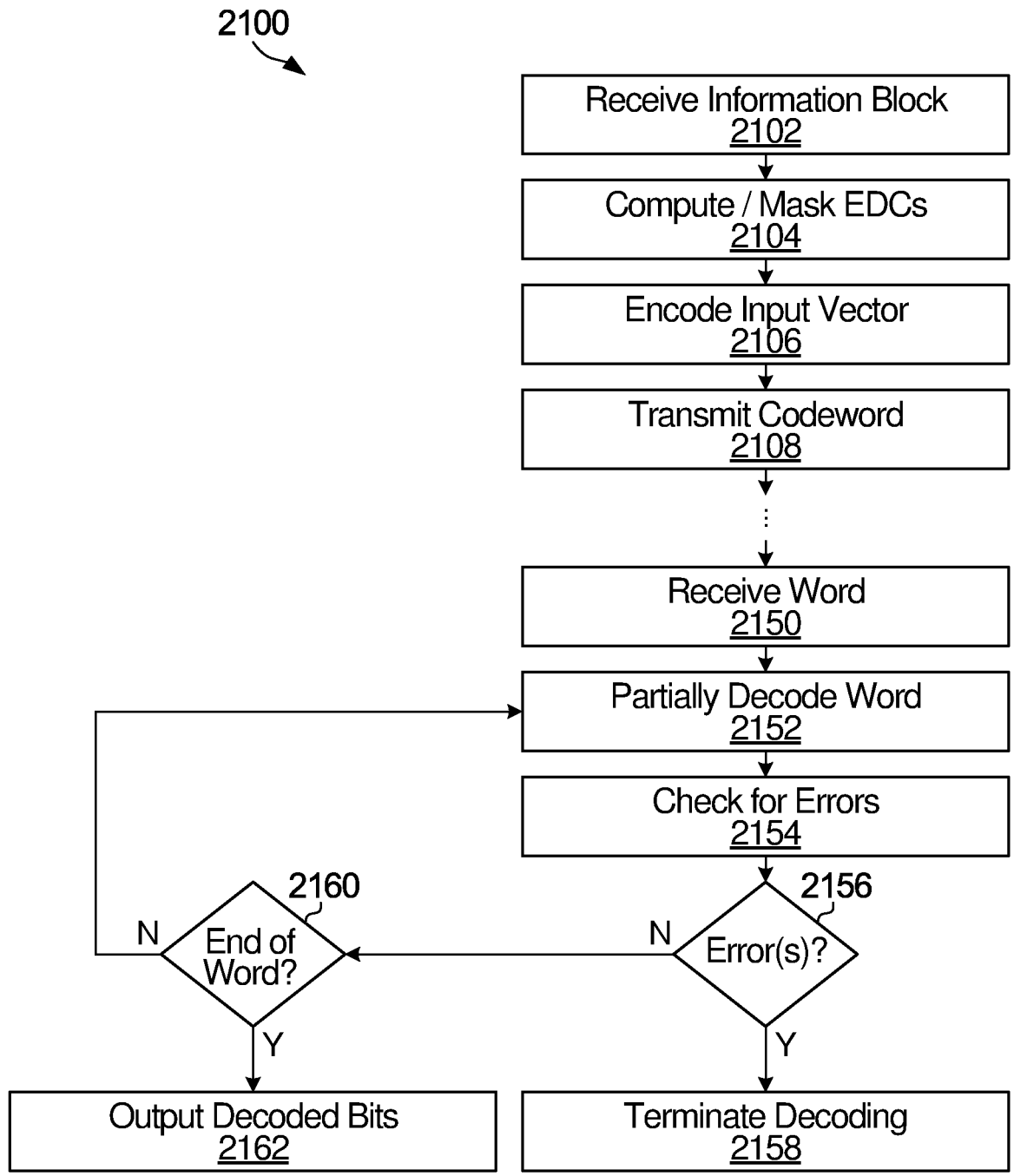
FIG. 21 is a flow diagram of an example method according to another embodiment.

FIG. 21 is a flow diagram of an example method according to another embodiment. The illustrated example method 2100 includes receiving an information block at 2102, and determining or computing and masking EDCs at 2104. The determining or computing and masking at 2104 includes at least determining or computing a first error-detecting code (EDC) based on a first segment of a block of information that is to be encoded and a second EDC based on at least a second segment of the block of information, and masking the first EDC with a first masking segment and the second EDC with a second masking segment to generate a first masked EDC and a second masked EDC. The first masking segment and the second masking segment are associated with a target receiver of the block of information.

The method 2100 also includes encoding an input vector at 2106 to generate a codeword based on a code. The input vector includes the first segment, the first masked EDC, the second segment, and the second masked EDC. The codeword is transmitted at 2108.

FIG. 21 also shows example operations that are performed at a receiver/decoder. At 2150, a word that is based on a codeword of a code is received. The received word is partially decoded at 2152, by decoding a first segment of a block of information and a first masked error-detecting code (EDC) from the received word. The partially decoded word is then checked for errors at 2154, by de-masking a first EDC from the first masked EDC with a first masking segment associated with a receiver and error checking the first segment using the first EDC. Based on whether the error checking of the first segment passes (whether any errors are detected at 2156), either decoding of the received word is terminated at 2158, or decoding proceeds. In the example method 2100, decoding proceeds by determining at 2160 whether the end of the received word has been reached, and if not, another segment of the block of information and a second masked EDC are decoded from the received word at 2152, and processing continues as described above for the first segment. If the entire received word is successfully decoded, then decoded bits are output at 2162.

The example method in FIG. 21 is intended for illustrative purposes. Other embodiments could involve performing the illustrated operations in any of various ways, performing fewer or additional operations, and/or varying the order in which operations are performed. Retransmission of a codeword could be requested in the event of decoding termination at 2158, for instance. Other variations could be or become apparent to a skilled person based on the present disclosure.

For example, any one or more of the following could be provided, alone or in any of various combinations, in embodiments:

the code is a polar code;

the decoding comprises successive cancellation based decoding;

the first EDC and the second EDC are cyclic redundancy check (CRC) codes, checksum codes, or Fletcher codes;

the determining or computing and masking at 2104 comprises determining or computing the second EDC based on the first segment, the first EDC (or the masked first EDC), and the second segment;

the error checking at 2154 for at least the second segment comprises error checking the first segment, the first EDC, and the second segment using the second EDC;

the first segment has a length $m_1$, the second segment has a length $m_2$, and $m_1$ is different from $m_2$;

the first EDC has a length $p_1$, the second EDC has a length $p_2$, and $p_1$ is different from $p_2$;

the first masking segment and the second masking segment are based on an identifier associated with the target receiver;

the identifier is a Radio Network Temporary Identifier (RNTI);

the first masking segment comprises a first part of the identifier;

the second masking segment comprises a second part of the identifier;

a method further includes, for each of at least one further segment that follows the second segment in the block of information: determining or computing a further EDC based on at least the further segment; and masking the further EDC with a further masking segment that is associated with the target receiver to generate a further masked EDC, wherein the input vector includes the first segment, the first masked EDC, the second segment, the second masked EDC, each further segment, and each further masked EDC;

the decoding proceeds, after decoding the second segment and the second masked EDC from the received word, by de-masking a second EDC from the second masked EDC with a second masking segment associated with the receiver; and error checking at least the second segment at 2154 using the second EDC;

the method further comprises, for each of at least one further segment that follows the second segment in the block of information, and based on whether the error check of the segment preceding the further segment passes, either: terminating decoding of the received word at 2158; or proceeding at 2152 with decoding the further segment and a further masked EDC from the received word and de-masking a further EDC from the further masked EDC using a further masking segment associated with the receiver, and error checking at least the further segment at 2154 using the further EDC.

Figure 22:
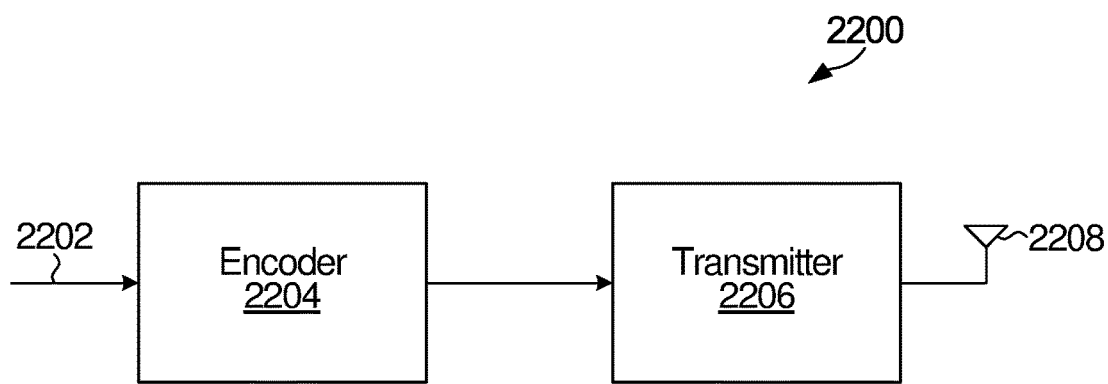
FIG. 22 is a block diagram of an apparatus for encoding and transmitting codewords.

Embodiments are described above primarily in the context of illustrative example methods. Apparatus embodiments are also contemplated. For example, FIG. 22 is a block diagram of an apparatus for encoding and transmitting codewords. The apparatus 2200 includes an encoder 2204 coupled to a transmitter 2206. In the illustrated embodiment, the apparatus 2200 also includes an antenna 2208, coupled to the transmitter 2206, for transmitting signals over a wireless channel. In some embodiments, the transmitter 2206 includes a modulator, an amplifier, and/or other components of an RF transmit chain. The encoder 2204 receives input 2202 comprising information symbols, and is configured to implement a method described herein to encode the information bits or symbols into a codeword. The codeword could be provided to the transmitter 2206 for transmission via the antenna 2208.

The encoder 2204 is implemented in circuitry, such as a processor, that is configured to encode input bits as disclosed herein. In a processor-based implementation of the encoder 2204, processor-executable instructions to configure a processor to perform encoding operations are stored in a non-transitory processor-readable medium. The non-transitory medium could include one or more solid-state memory devices and/or memory devices with movable and possibly removable storage media.

In some alternative embodiments, the encoder 2204 and the transmitter 2206 described herein may be fully or partially implemented in software or modules, for example in encoding, and transmitting, modules stored in a memory and executed by a processor(s) of the apparatus 2200.

In an embodiment, an apparatus is implemented using a processor configured to perform encoding. The processor could be configured to: determine or calculate a first EDC based on a first group of information symbols in a block of information symbols that are to be encoded, the information symbols including at least one multi-bit information symbol; determine or calculate a second EDC based on at least a second group of information symbols that follow the first group of information symbols in the information block; and generate a codeword based on a generator matrix for a polar code and an input vector that includes the first group of information symbols, the first EDC, the second group of information symbols, and the second EDC; and a transmitter 1206, coupled to the processor, for transmitting the codeword.

Any one or more of the following could be provided, alone or in any of various combinations, in embodiments:

the processor is configured to determine or calculate the second EDC based on the first group of information symbols, the first EDC, and the second group of information symbols;

the first group of information symbols includes $m_1$ symbols, the second group of information symbols includes $m_2$ symbols, and $m_1$ is different from $m_2$;

the first EDC includes $p_1$ bits, the second EDC includes $p_2$ bits, and $p_1$ is different from $p_2$;

the first EDC and the second EDC are CRC codes, checksum codes, or Fletcher Codes;

the processor is further configured to insert at least one frozen symbol into the input vector;

the processor is further configured to, for each of at least one group of information symbols that follow the second group of information symbols in the information block:

determine or calculate a further EDC based on at least a further group of information symbols that follow the second group of information symbols in the information block; wherein the input vector includes the first group of information symbols, the first EDC, the second group of information symbols, the second EDC, the further group of information symbols, and the further EDC;

the processor is further configured to: generate information indicative of any one or more of: a number of information symbols in the first group of information symbols, a number of information symbols in the second group of information symbols, a length of the first EDC, and a length of the second EDC; and provide the generated information to the transmitter for transmission.

In some embodiments, encoder 2204 is configured to determine or compute a first EDC based on a first segment of a block of information that is to be encoded and a second EDC based on at least a second segment of the block of information, to mask the first EDC with a first masking segment and the second EDC with a second masking segment to generate a first masked EDC and a second masked EDC, the first masking segment and the second masking segment being associated with a target receiver of the block of information, and to generate a codeword based on a code and an input vector that includes the first segment, the first masked EDC, the second segment, and the second masked EDC. The transmitter 2206 is configured to transmit the codeword.

The apparatus 2200 could implement any of various other features that are disclosed herein. For example, any one or more of the following could be provided, alone or in any of various combinations, in embodiments:

the code is a polar code;

the first EDC and the second EDC are cyclic redundancy check (CRC) codes, checksum codes, or Fletcher codes;

the encoder is configured to determine or compute the second EDC based on the first segment, the first EDC (or the masked first EDC), and the second segment;

the first segment has a length $m_1$, the second segment has a length $m_2$, and $m_1$ is different from $m_2$;

the first EDC has a length $p_1$, the second EDC has a length $p_2$, and $p_1$ is different from $p_2$;

the first masking segment and the second masking segment are based on an identifier associated with the target receiver;

the identifier is a Radio Network Temporary Identifier (RNTI);

the first masking segment comprises a first part of the identifier;

the second masking segment comprises a second part of the identifier;

the encoder is further configured to, for each of at least one further segment that follows the second segment in the block of information: determine or compute a further EDC based on at least the further segment; and mask the further EDC with a further masking segment that is associated with the target receiver to generate a further masked EDC, wherein the input vector includes the first segment, the first masked EDC, the second segment, the second masked EDC, each further segment, and each further masked EDC.

Figure 23:
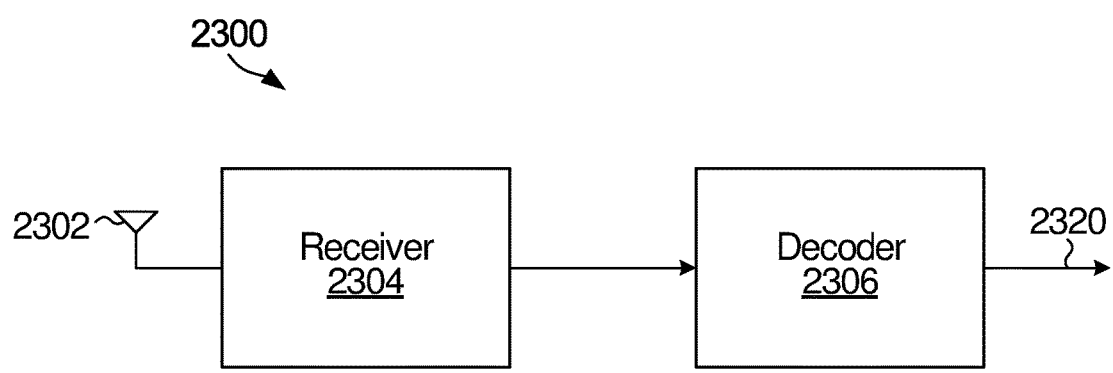
FIG. 23 is a block diagram of an example apparatus for receiving and decoding codewords.

FIG. 23 is a block diagram of an example apparatus for receiving and decoding codewords. The apparatus 2300 includes a receiver 2304 coupled to an antenna 2302 for receiving signals from a wireless channel, and to a decoder 2306. In some embodiments, the receiver 2304 includes a demodulator, an amplifier, and/or other components of an RF receive chain. Decoded bits are output at 2320 for further receiver processing. The receiver 2304 receives via the antenna 2302 a signal carrying a received word that is based on a codeword. The received word is provided to the decoder 2306. The decoder 2306 is configured to implement a method described herein to decode the received word into an output that includes information symbols and is provided as output 2320 from the decoder.

In some embodiments, the apparatus 2300, and similarly the apparatus 2200 in FIG. 22, include a non-transitory computer readable medium that includes instructions for execution by a processor to implement and/or control operation of the encoder 2204 in FIG. 22, to implement and/or control operation of the decoder 2306 in FIG. 23, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk.

In some alternative embodiments, the receiver 2304 and the decoder 2306 described herein may be fully or partially implemented in software or modules, for example in receiving and decoding modules stored in a memory and executed by a processor(s) of the apparatus 2300.

In an embodiment, an apparatus is implemented using a receiver for receiving a word that is based on a codeword. The codeword is a codeword that was generated based on a generator matrix for a polar code and an input vector that includes a first group of information symbols in a block of information symbols, a first EDC that protects the first group of information symbols, a second group of information symbols that follow the first group of information symbols in the information block, and a second EDC that protects at least the second group of information symbols. A processor could be coupled to the receiver and configured to: decode the first group of information symbols and the first EDC from the received word; check the decoded first group of information symbols for errors using the decoded first EDC; and decode the second group of information symbols and the second EDC from the received word if no errors are detected in the decoded first group of information symbols.

Any one or more of the following could be provided, alone or in any of various combinations, in embodiments:

the first EDC and the second EDC are cyclic redundancy check (CRC) codes, checksum codes, or Fletcher Codes;

the processor is configured to decode the first group of information symbols, the first EDC, the second first group of information bits, and the second EDC by List decoding the received word;

the List decoding comprises using different list sizes for decoding the first group of information symbols and the second first group of information symbols.

In some embodiments, the receiver 2304 is configured to receive a word that is based on a codeword of a code. The decoder 2306 is configured to decode a first segment of a block of information and a first masked EDC from the received word, to de-mask a first EDC from the first masked EDC with a first masking segment associated with the receiver, to error check the first segment using the first EDC, and, based on whether the error check of the first segment passes, to either terminate decoding of the received word or proceed with decoding a second segment of the block of information and a second masked EDC from the received word.

The apparatus 2300 could implement any of various other features that are disclosed herein. For example, any one or more of the following could be provided, alone or in any of various combinations, in embodiments:

the decoder is further configured to, after decoding the second segment and the second masked EDC from the received word, de-mask a second EDC from the second masked EDC with a second masking segment associated with the receiver, and error check at least the second segment using the second EDC;

the decoder is configured to error check the first segment, the first EDC, and the second segment using the second EDC;

the first masking segment and the second masking segment are based on an identifier associated with the receiver;

the identifier is a Radio Network Temporary Identifier (RNTI);

the first masking segment comprises a first part of the identifier;

the second masking segment comprises a second part of the identifier;

the code is a polar code and the decoder implements successive cancellation based decoding;

the first EDC and the second EDC are CRC codes, checksum codes, or

Fletcher codes;

the first segment has a length $m_1$, the second segment has a length $m_2$, and $m_1$ is different from $m_2$;

the first EDC has a length $p_1$, the second EDC has a length $p_2$, and $p_1$ is different from $p_2$;

the decoder is further configured to, for each of at least one further segment that follows the second segment in the block of information, and based on whether the error check of the segment preceding the further segment passes, either: terminate decoding of the received word; or proceed with decoding the further segment and a further masked EDC from the received word, de-masking a further EDC from the further masked EDC using a further masking segment associated with the receiver, and error checking at least the further segment using the further EDC.

Figure 24:
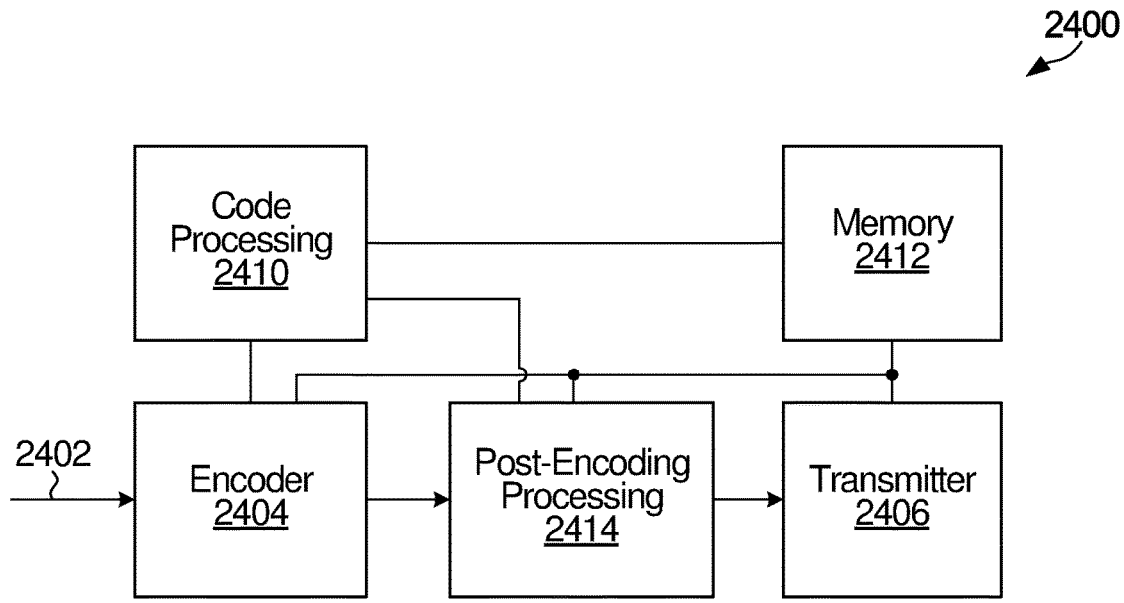
FIG. 24 is a block diagram of another example apparatus for encoding and transmitting codewords.

FIG. 24 is a block diagram of an apparatus for encoding and transmitting codewords. The apparatus 2400 includes an encoder module 2404 coupled to a transmitter module 2406. The apparatus 2400 also includes a code processing module 2410 coupled to the encoder module 2404 and a post-encoding processing module 2414. The post-encoding processing module 2414 is also coupled to the encoder module 2404 and to the transmitter module 2406. A memory 2412, also shown in FIG. 24, is coupled to the encoder module 2404, to the code processing module 2410, to the post-encoding processing module 2414, and to the transmitter module 2406. Although not shown, the transmitter module 2406 could include a modulator, an amplifier, antenna and/or other modules or components of a transmit chain or alternatively could be configured to interface with a separate (Radio-Frequency—RF) transmission module. For example, some or all of the modules 2404, 2406, 2410, 2412, 2414 of the apparatus 2400 may be implemented in hardware or circuitry (e.g. in one or more chipsets, microprocessors, application-specific integrated circuits (ASIC), field-programmable gate arrays (FPGAs), dedicated logic circuitry, or combinations thereof) so as to produce codewords as described herein for transmission by a separate (RF) unit.

In some embodiments, the memory 2412 is a non-transitory computer readable medium at 2412, that includes instructions for execution by a processor to implement and/or control operation of the code processing module 2410, the encoder module 2404, the post-encoding processing module 2414, the transmitter module 2406 in FIG. 24, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 2412.

In some embodiments, the encoder module 2404 is implemented in circuitry, such as a processor, that is configured to encode input bits or symbols as disclosed herein, and/or as described by way of example above with reference to FIG. 22, for example. In a processor-based implementation of the encoder module 2404, processor-executable instructions to configure a processor to perform encoding operations are stored in a non-transitory processor-readable medium. The non-transitory medium could include, in the memory 2412 for example, one or more solid-state memory devices and/or memory devices with movable and possibly removable storage media.

The code processing module 2410 could be implemented in circuitry that is configured to determine coding parameters such as mother code block length, and to determine an ordered sub-channel sequence as disclosed herein. In some embodiments, the code processing module 2410 is implemented using a processor. The same processor or other circuitry, or separate processors or circuitry, could be used to implement both the encoder module 2404 and the code processing module 2410. As noted above for the encoder module 2404, in a processor-based implementation of the code processing module 2410, processor-executable instructions to configure a processor to perform code processing operations are stored in a non-transitory processor-readable medium, in the memory 2412 for example.

Like the encoder module 2404 and the code processing module 2410, the post-encoding processing module 2414 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 2414, processor-executable instructions to configure a processor to perform post-encoding operations are stored in a non-transitory processor-readable medium, examples of which are described above. In an embodiment, the post-encoding processing module 2414 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 2410, stored to the memory 2412, or otherwise made available to the code processing module 2410 by the post-encoding processing module 2414.

The apparatus 2400 could implement any of various other features that are disclosed herein. For example, the encoder module 2404, the transmitter module 2406, the code processing module 2410, and/or the post-encoding processing module 2414 could be configured to implement any one or more of the features listed or otherwise described herein.

In some alternative embodiments, the functionality of the encoder module 2404, the transmitter module 2406, the code processing module 2410, and/or the post-encoding processing module 2414 described herein may be fully or partially implemented in hardware or alternatively in software, for example in modules stored in a memory such as 2412 and executed by one or more processors of the apparatus 2400.

An apparatus could therefore include a processor, and a memory such as 2412, coupled to the processor, storing instructions which, when executed by the processor, cause the processor to perform the functionality and/or embodiments described above in relation to the encoder module 2404, the transmitter module 2406, the code processing module 2410, and/or the post-encoding module 2414 described herein.

Figure 25:
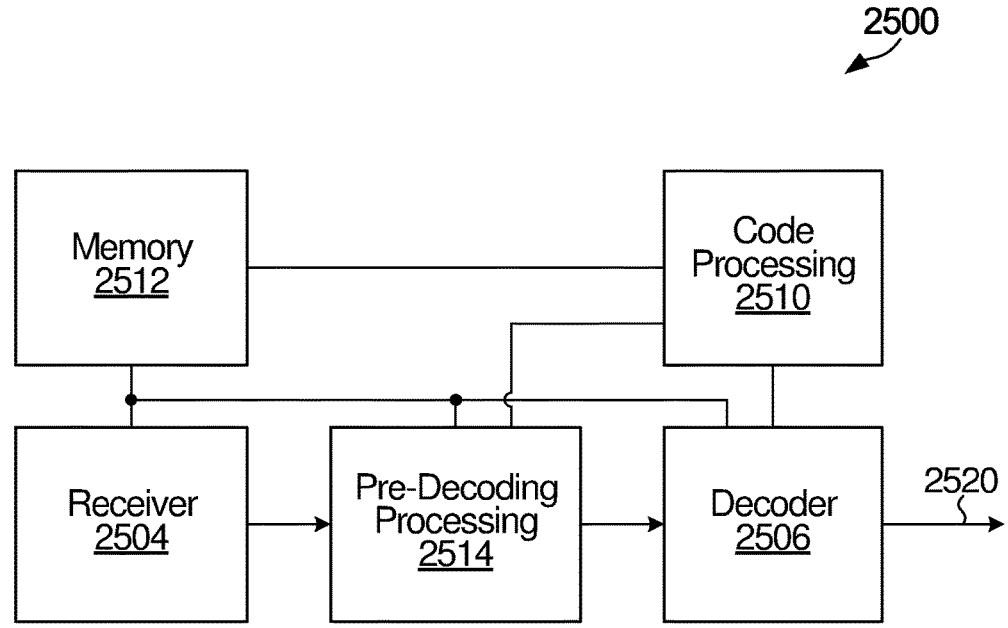
FIG. 25 is a block diagram of an example apparatus for receiving and decoding codewords.

FIG. 25 is a block diagram of an example apparatus for receiving and decoding codewords. The apparatus 2500 includes a receiver module 2504 which is configured to receive signals transmitted wirelessly and which is coupled to a decoder module 2506. The apparatus 2500 also includes a code processing module 2510 coupled to the decoder module 2506 and a pre-decoding processing module 2514. The pre-decoding processing module 2514 is also coupled to the decoder module 2506 and to the receiver module 2504. A memory 2512 also shown in FIG. 25, is coupled to the decoder module 2506, to the code processing module 2510, to the receiver module 2504, and to the pre-decoding processing module 2514.

Although not shown, the receiver module 2504 could include an antenna, demodulator, amplifier, and/or other modules or components of a receive chain or alternatively could be configured to interface with a separate (Radio-Frequency—RF) receiving module. For example, some or all of the modules 2504, 2506, 2510, 2512, 2514 of the apparatus 2500 may be implemented in hardware or circuitry (e.g. in one or more chipsets, microprocessors, ASICs, FPGAs, dedicated logic circuitry, or combinations thereof) so as to receive a word based on a codeword of a polar code as described herein. Decoded bits are output at 2520 for further receiver processing.

In some embodiments, the memory 2512 is a non-transitory computer readable medium that includes instructions for execution by a processor to implement and/or control operation of the receiver module 2504, decoder module 2506, the code processing module 2510, and the pre-decoding processing module 2514 in FIG. 25, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 2512.

The decoder module 2506 is implemented in circuitry, such as a processor, that is configured to decode received codewords as disclosed herein, and/or as described by way of example above with reference to FIG. 23, for example. In a processor-based implementation of the decoder module 2506, processor-executable instructions to configure a processor to perform decoding operations are stored in a non-transitory processor-readable medium. The non-transitory medium could include, in the memory 2512 for example, one or more solid-state memory devices and/or memory devices with movable and possibly removable storage media.

The code processing module 2510 is implemented in circuitry that is configured to determine (and store to the memory 2512) ordered sub-channel sequences as disclosed herein. In a processor-based implementation of the code-processing module 2510, processor-executable instructions to configure a processor to perform code-processing operations are stored in a non-transitory processor-readable medium, examples of which are described above. Information representing ordered sub-channel sequences, and/or the selected sub-channels could be provided to the decoder module 2506 by the code processing module 2510 for use in decoding received words, and/or stored in the memory 2512 by the code processing module 2510 for subsequent use by the decoder module 2506.

Like the decoder module 2506 and the code processing module 2510, the pre-decoding processing module 2514 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 2514, processor-executable instructions to configure a processor to perform pre-decoding processing operations are stored in a non-transitory processor-readable medium, examples of which are described above. In an embodiment, the pre-decoding processing module 2514 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 2510, stored to the memory 2512, or otherwise made available to the code processing module 2510 by the pre-decoding processing module 2514.

In some alternative embodiments, the functionality of the receiver module 2504, the decoder module 2506, the code processing module 2510, and/or the pre-decoding processing module 2514 described herein may be fully or partially implemented in software or modules, for example in receiving and decoding modules stored in a memory 2512 and executed by one or more processors of the apparatus 2500.

An apparatus could therefore include a processor, and a memory such as 2512, coupled to the processor, storing instructions which, when executed by the processor, cause the processor to perform the functionality and/or embodiments disclosed herein, or receiving/decoding operations corresponding to transmitting/encoding operations disclosed herein.

The apparatus 2500 could implement any of various other features that are disclosed herein. For example, the decoder module 2506, the receiver module 2504, the code processing module 2510, and/or the pre-decoding processing module 2514 could be configured to implement any one or more of receiving/decoding features corresponding to encoding/transmitting features noted above.

Communication equipment could include the apparatus 2200, the apparatus 2300, the apparatus 2400, the apparatus 2500, or both a transmitter and a receiver and both an encoder and a decoder. Such communication equipment could be user equipment or communication network equipment.

Figure 26:
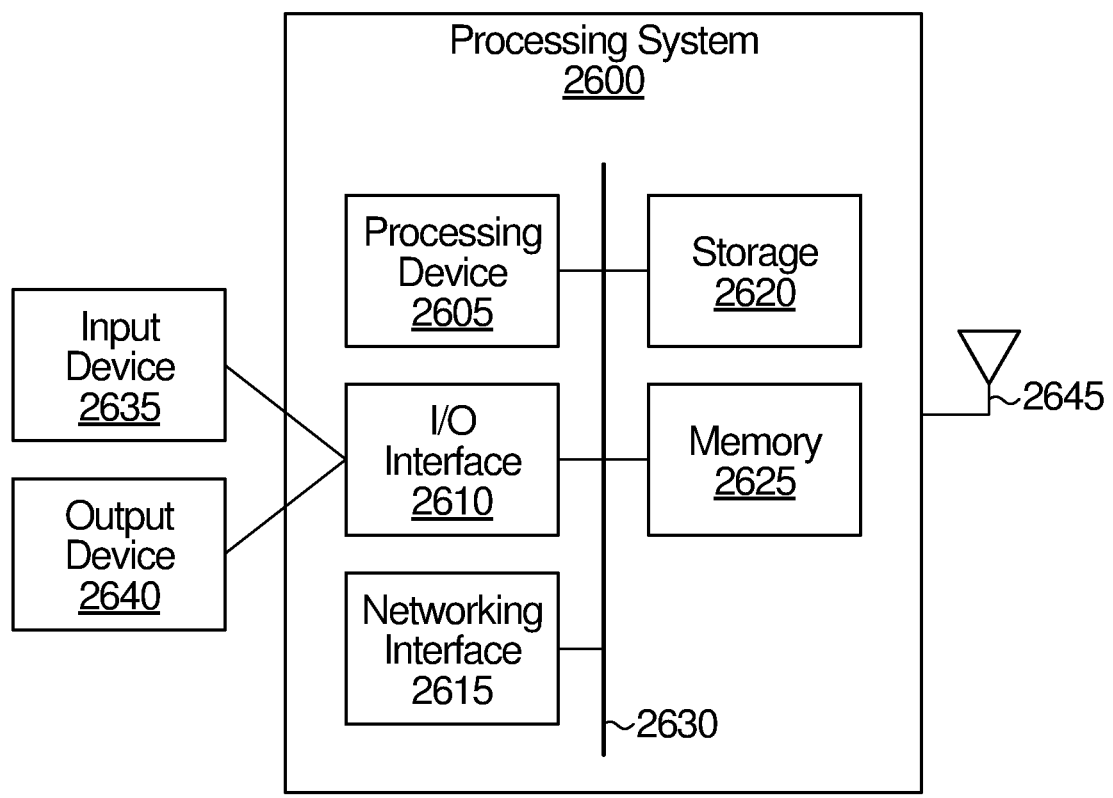
FIG. 26 is a block diagram of an example simplified processing system, which may be used to implement embodiments disclosed herein.

FIGS. 22 to 25 are generalized block diagrams of apparatus that could be used to implement coding as disclosed herein. FIG. 26 is a block diagram of an example simplified processing system 2600, which may be used to implement embodiments disclosed herein, and provides a higher level implementation example. The apparatus 2200, the apparatus 2300, the apparatus 2400, and/or the apparatus 2500, may be implemented using the example processing system 2600, or variations of the processing system 2600. The processing system 2600 could be a server or a mobile device, for example, or any suitable processing system. Other processing systems suitable for implementing embodiments described in the present disclosure may be used, which may include components different from those discussed below. Although FIG. 26 shows a single instance of each component, there may be multiple instances of each component in the processing system 2600.

The processing system 2600 may include one or more processing devices 2605, such as a processor, a microprocessor, an application-specific integrated circuit (ASIC), a field-programmable gate array (FPGA), a dedicated logic circuitry, or combinations thereof. The processing system 2600 may also include one or more input/output (I/O) interfaces 2610, which may enable interfacing with one or more appropriate input devices 2635 and/or output devices 2640. The processing system 2600 may include one or more network interfaces 2615 for wired or wireless communication with a network (e.g., an intranet, the Internet, a P2P network, a WAN and/or a LAN) or other node. The network interfaces 2615 may include wired links (e.g., Ethernet cable) and/or wireless links (e.g., one or more antennas) for intra-network and/or inter-network communications. The network interfaces 2615 may provide wireless communication via one or more transmitters or transmit antennas and one or more receivers or receive antennas, for example. In this example, a single antenna 2645 is shown, which may serve as both transmitter and receiver. However, in other examples there may be separate antennas for transmitting and receiving. The processing system 2600 may also include one or more storage units 2620, which may include a mass storage unit such as a solid state drive, a hard disk drive, a magnetic disk drive and/or an optical disk drive.

The processing system 2600 may include one or more memories 2625, which may include a volatile or non-volatile memory (e.g., a flash memory, a random access memory (RAM), and/or a read-only memory (ROM)). The non-transitory memories 2625 may store instructions for execution by the processing devices 2605, such as to carry out examples described in the present disclosure. The memories 2625 may include other software instructions, such as for implementing an operating system and other applications/functions. In some examples, one or more data sets and/or modules may be provided by an external memory (e.g., an external drive in wired or wireless communication with the processing system 2600) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2630 providing communication among components of the processing system 2600. The bus 2630 may be any suitable bus architecture including, for example, a memory bus, a peripheral bus or a video bus. In FIG. 26, the input devices 2635 (e.g., a keyboard, a mouse, a microphone, a touchscreen, and/or a keypad) and output devices 2640 (e.g., a display, a speaker and/or a printer) are shown as external to the processing system 2600. In other examples, one or more of the input devices 2635 and/or the output devices 2640 may be included as a component of the processing system 2600.

Figure 27:
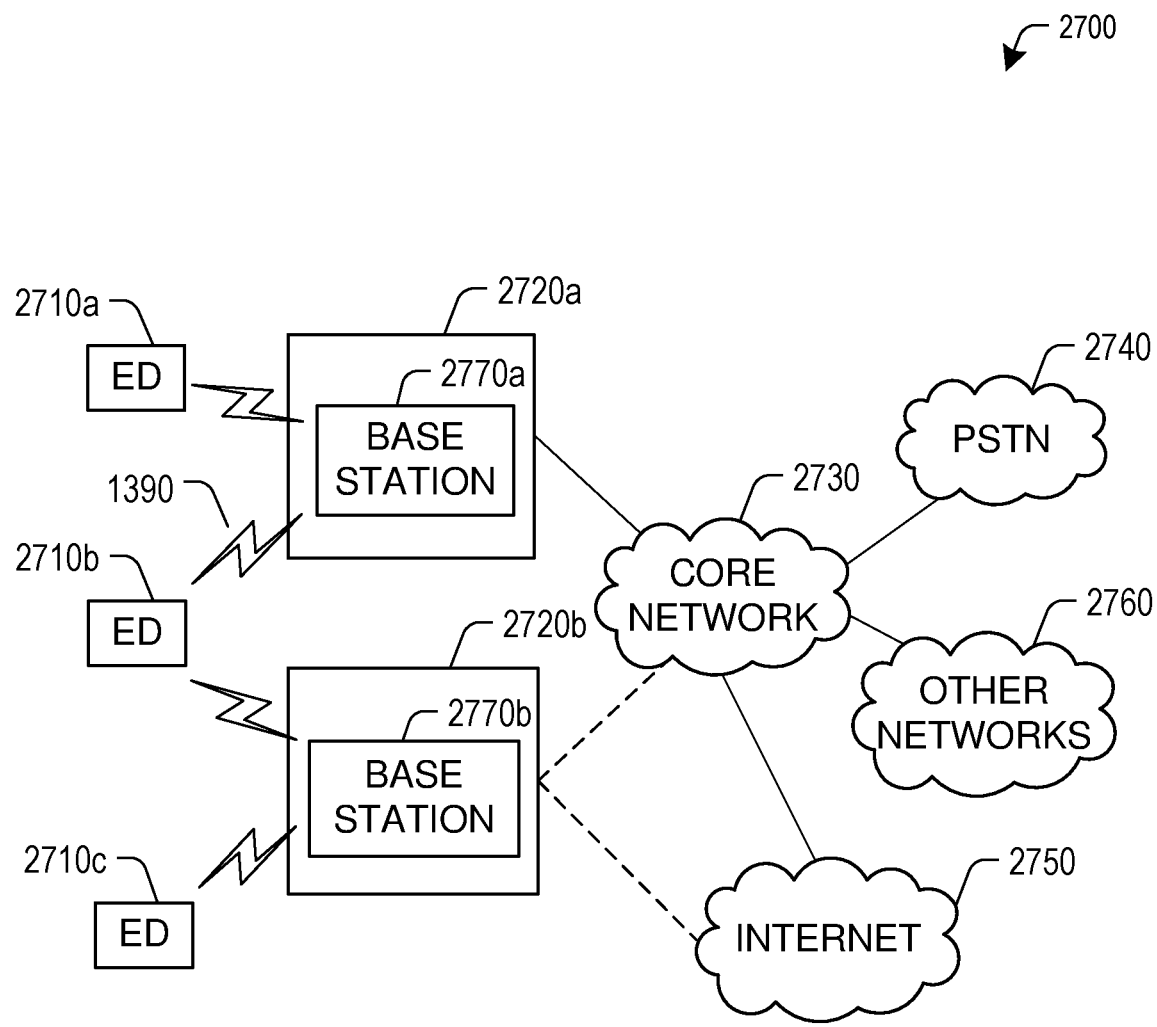
FIG. 27 is a block diagram of an example communication system in which embodiments disclosed herein may be used.

FIG. 27 illustrates an example communication system 2700 in which embodiments of the present disclosure could be implemented. In general, the communication system 2700 enables multiple wireless or wired elements to communicate data and other content. The purpose of the communication system 2700 may be to provide content (voice, data, video, text) via broadcast, narrowcast, user device to user device, etc. The communication system 2700 may operate by sharing resources such as bandwidth.

In this example, the communication system 2700 includes electronic devices (ED) 2710a-2710c, radio access networks (RANs) 2720a-2720b, a core network 2730, a public switched telephone network (PSTN) 2740, the internet 2750, and other networks 2760. Although certain numbers of these components or elements are shown in FIG. 27, any reasonable number of these components or elements may be included.

The EDs 2710a-2710c and base stations 2770a-2770b are examples of communication equipment that can be configured to implement some or all of the functionality and/or embodiments described herein. For example, any one of the EDs 2710a-2710c and base stations 2770a-2770b could be configured to implement the encoding or decoding functionality (or both) described herein. In another example, any one of the EDs 2710a-2710c and base stations 2770a-2770b could include the apparatus 2200, the apparatus 2300, the apparatus 2400, and/or the apparatus 2500 described above in relation to FIGS. 22 to 25.

The EDs 2710a-2710c are configured to operate, communicate, or both, in the communication system 2700. For example, the EDs 2710a-2710c are configured to transmit, receive, or both via wireless or wired communication channels. Each ED 2710a-2710c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 27, the RANs 2720a-2720b include base stations 2770a-2770b, respectively. Each base station 2770a-2770b is configured to wirelessly interface with one or more of the EDs 2710a-2710c to enable access to any other base station 2770a-2770b, the core network 2730, the PSTN 2740, the Internet 2750, and/or the other networks 2760. For example, the base stations 2770a-2770b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 2710a-2710c may be alternatively or additionally configured to interface, access, or communicate with any other base station 2770a-2770b, the internet 2750, the core network 2730, the PSTN 2740, the other networks 2760, or any combination of the preceding. The communication system 2700 may include RANs, such as RAN 2720b, wherein the corresponding base station 2770b accesses the core network 2730 via the internet 2750, as shown.

The EDs 2710a-2710c and base stations 2770a-2770b are examples of communication equipment that can be configured to implement some or all of the functionality and/or embodiments described herein. In the embodiment shown in FIG. 27, the base station 2770a forms part of the RAN 2720a, which may include other base stations, base station controller(s) (BSC), radio network controller(s) (RNC), relay nodes, elements, and/or devices. Any base station 2770a, 2770b may be a single element, as shown, or multiple elements, distributed in the corresponding RAN, or otherwise. Also, the base station 2770b forms part of the RAN 2720b, which may include other base stations, elements, and/or devices. Each base station 2770a-2770b transmits and/or receives wireless signals within a particular geographic region or area, sometimes referred to as a "cell" or "coverage area". A cell may be further divided into cell sectors, and a base station 2770a-2770b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 2720a-2720b shown is exemplary only. Any number of RAN may be contemplated when devising the communication system 2700.

The base stations 2770a-2770b communicate with one or more of the EDs 2710a-2710c over one or more air interfaces 2790 using wireless communication links e.g. radio frequency (RF), microwave, infrared (IR), etc. The air interfaces 2790 may utilize any suitable radio access technology. For example, the communication system 2700 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 2790.

A base station 2770a-2770b may implement Universal Mobile Telecommunication System (UMTS) Terrestrial Radio Access (UTRA) to establish an air interface 2790 using wideband CDMA (WCDMA). In doing so, the base station 2770a-2770b may implement protocols such as HSPA, HSPA+ optionally including HSDPA, HSUPA or both. Alternatively, a base station 2770a-2770b may establish an air interface 2790 with Evolved UTMS Terrestrial Radio Access (E-UTRA) using LTE, LTE-A, and/or LTE-B. It is contemplated that the communication system 2700 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 2720a-2720b are in communication with the core network 2730 to provide the EDs 2710a-2710c with various services such as voice, data, and other services. The RANs 2720a-2720b and/or the core network 2730 may be in direct or indirect communication with one or more other RANs (not shown), which may or may not be directly served by core network 2730, and may or may not employ the same radio access technology as RAN 2720a, RAN 2720b or both. The core network 2730 may also serve as a gateway access between (i) the RANs 2720a-2720b or EDs 2710a-2710c or both, and (ii) other networks (such as the PSTN 2740, the internet 2750, and the other networks 2760). In addition, some or all of the EDs 2710a-2710c may include functionality for communicating with different wireless networks over different wireless links using different wireless technologies and/or protocols. Instead of wireless communication (or in addition thereto), the EDs 2710a-2710c may communicate via wired communication channels to a service provider or switch (not shown), and to the internet 2750. PSTN 2740 may include circuit switched telephone networks for providing plain old telephone service (POTS). Internet 2750 may include a network of computers and subnets (intranets) or both, and incorporate protocols, such as IP, TCP, UDP. EDs 2710a-2710c may be multimode devices capable of operation according to multiple radio access technologies, and incorporate multiple transceivers necessary to support such.

Figure 28A:
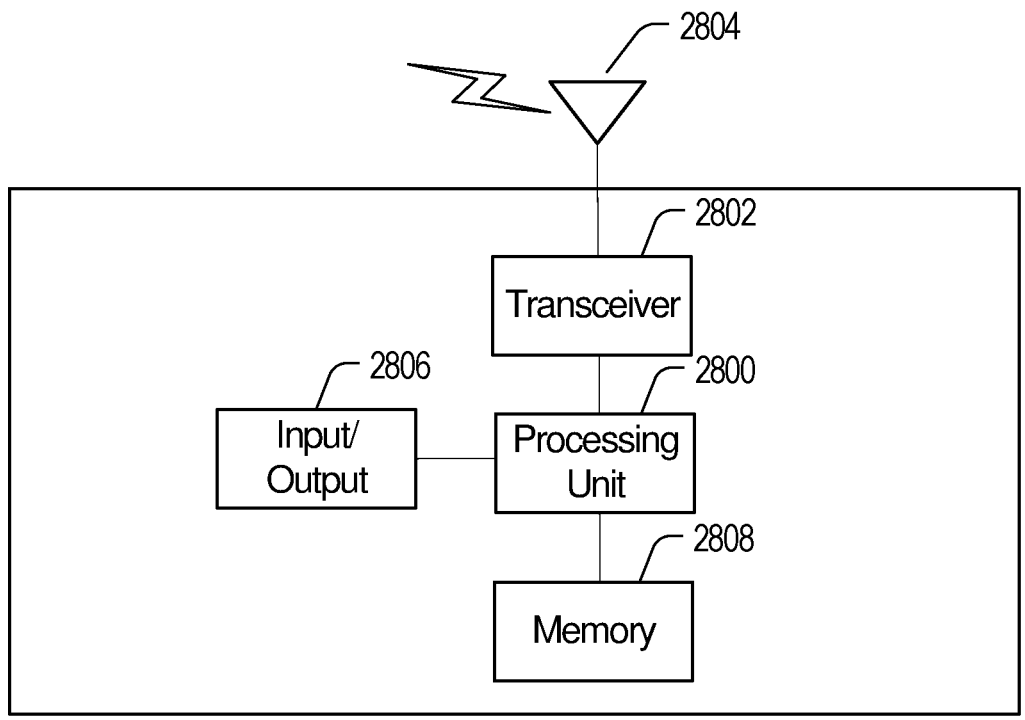
FIGS. 28A-B are block diagrams of an example Electronic Device (ED) and an example base station which may implement embodiments disclosed herein.
Figure 28B:
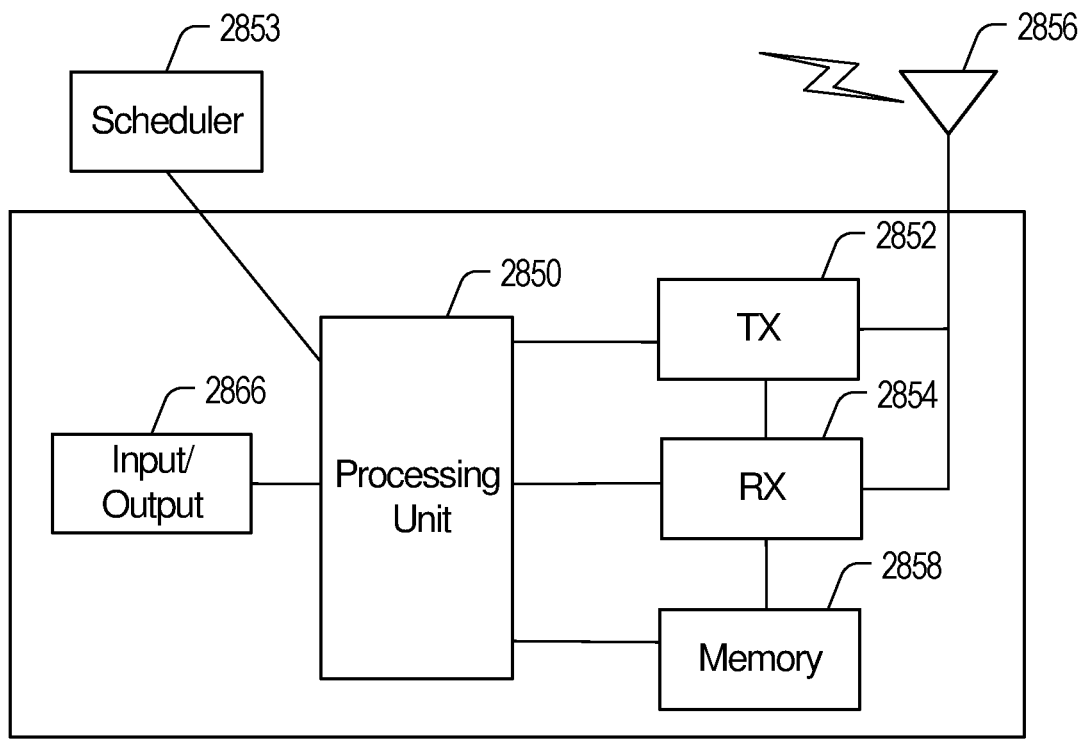

FIGS. 28A and 28B illustrate example devices that may implement the methods and teachings according to this disclosure. In particular, FIG. 28A illustrates an example ED 2710, and FIG. 28B illustrates an example base station 2770. These components could be used in the communication system 2700 or in any other suitable system.

As shown in FIG. 28A, the ED 2710 includes at least one processing unit 2800. The processing unit 2800 implements various processing operations of the ED 2710. For example, the processing unit 2800 could perform signal coding, data processing, power control, input/output processing, or any other functionality enabling the ED 2710 to operate in the communication system 2700. The processing unit 2800 may also be configured to implement some or all of the functionality and/or embodiments described in more detail above. Each processing unit 2800 includes any suitable processing or computing device configured to perform one or more operations. Each processing unit 2800 could, for example, include a microprocessor, microcontroller, digital signal processor, field programmable gate array, or application specific integrated circuit.

The ED 2710 also includes at least one transceiver 2802. The transceiver 2802 is configured to modulate data or other content for transmission by at least one antenna or Network Interface Controller (NIC) 2804. The transceiver 2802 is also configured to demodulate data or other content received by the at least one antenna 2804. Each transceiver 2802 includes any suitable structure for generating signals for wireless or wired transmission and/or processing signals received wirelessly or by wire. Each antenna 2804 includes any suitable structure for transmitting and/or receiving wireless or wired signals. One or multiple transceivers 2802 could be used in the ED 2710, and one or multiple antennas 2804 could be used in the ED 2710. Although shown as a single functional unit, a transceiver 2802 could also be implemented using at least one transmitter and at least one separate receiver.

The ED 2710 further includes one or more input/output devices 2806 or interfaces (such as a wired interface to the internet 2750). The input/output devices 2806 permit interaction with a user or other devices in the network. Each input/output device 2806 includes any suitable structure for providing information to or receiving information from a user, such as a speaker, microphone, keypad, keyboard, display, or touch screen, including network interface communications.

In addition, the ED 2710 includes at least one memory 2808. The memory 2808 stores instructions and data used, generated, or collected by the ED 2710. For example, the memory 2808 could store software instructions or modules configured to implement some or all of the functionality and/or embodiments described above and that are executed by the processing unit(s) 2800. Each memory 2808 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 28B, the base station 2770 includes at least one processing unit 2850, at least one transmitter 2852, at least one receiver 2854, one or more antennas 2856, at least one memory 2858, and one or more input/output devices or interfaces 2866. A transceiver, not shown, may be used instead of the transmitter 2852 and receiver 2854. A scheduler 2853 may be coupled to the processing unit 2850. The scheduler 2853 may be included within or operated separately from the base station 2770. The processing unit 2850 implements various processing operations of the base station 2770, such as signal coding, data processing, power control, input/output processing, or any other functionality. The processing unit 2850 can also be configured to implement some or all of the functionality and/or embodiments described in more detail above. Each processing unit 2850 includes any suitable processing or computing device configured to perform one or more operations. Each processing unit 2850 could, for example, include a microprocessor, microcontroller, digital signal processor, field programmable gate array, or application specific integrated circuit.

Each transmitter 2852 includes any suitable structure for generating signals for wireless or wired transmission to one or more EDs or other devices. Each receiver 2854 includes any suitable structure for processing signals received wirelessly or by wire from one or more EDs or other devices. Although shown as separate components, at least one transmitter 2852 and at least one receiver 2854 could be combined into a transceiver. Each antenna 2856 includes any suitable structure for transmitting and/or receiving wireless or wired signals. Although a common antenna 2856 is shown here as being coupled to both the transmitter 2852 and the receiver 2854, one or more antennas 2856 could be coupled to the transmitter(s) 2852, and one or more separate antennas 2856 could be coupled to the receiver(s) 2854. Each memory 2858 includes any suitable volatile and/or non-volatile storage and retrieval device(s) such as those described above in connection to the ED 2710. The memory 2858 stores instructions and data used, generated, or collected by the base station 2770. For example, the memory 2858 could store software instructions or modules configured to implement some or all of the functionality and/or embodiments described above and that are executed by the processing unit(s) 2850.

Each input/output device 2866 permits interaction with a user or other devices in the network. Each input/output device 2866 includes any suitable structure for providing information to or receiving/providing information from a user, including network interface communications.

The embodiments described with reference to FIGS. 22 to 28 relate to example apparatus. Method embodiments are also described earlier herein. In another embodiment, a non-transitory processor-readable medium stores instructions which, when executed by one or more processors, cause the one or more processors to perform a method as disclosed herein.

Performance of distributed masked error detection coding as disclosed herein was assessed through simulation. Early termination using the first 8-bit CRC as shown in FIGS. 18 and 19 was assessed. The following performance metrics were considered for blind detection:

Missing Detection Rate: there is a PDCCH signal for the receiver on one candidate but the receiver does not detect it or the CRC fails.

False Alarm Rate: divided into two types:
  Type-1: there is nothing transmitted for the receiver on a candidate, but the receiver detects something and the CRC passes;
  Type-2: something for another receiver is transmitted on a candidate, but the receiver detects something and the CRC passes.

16-bit masked CRC as shown in FIGS. 16 and 17 was used as a benchmark.

Figure 29:
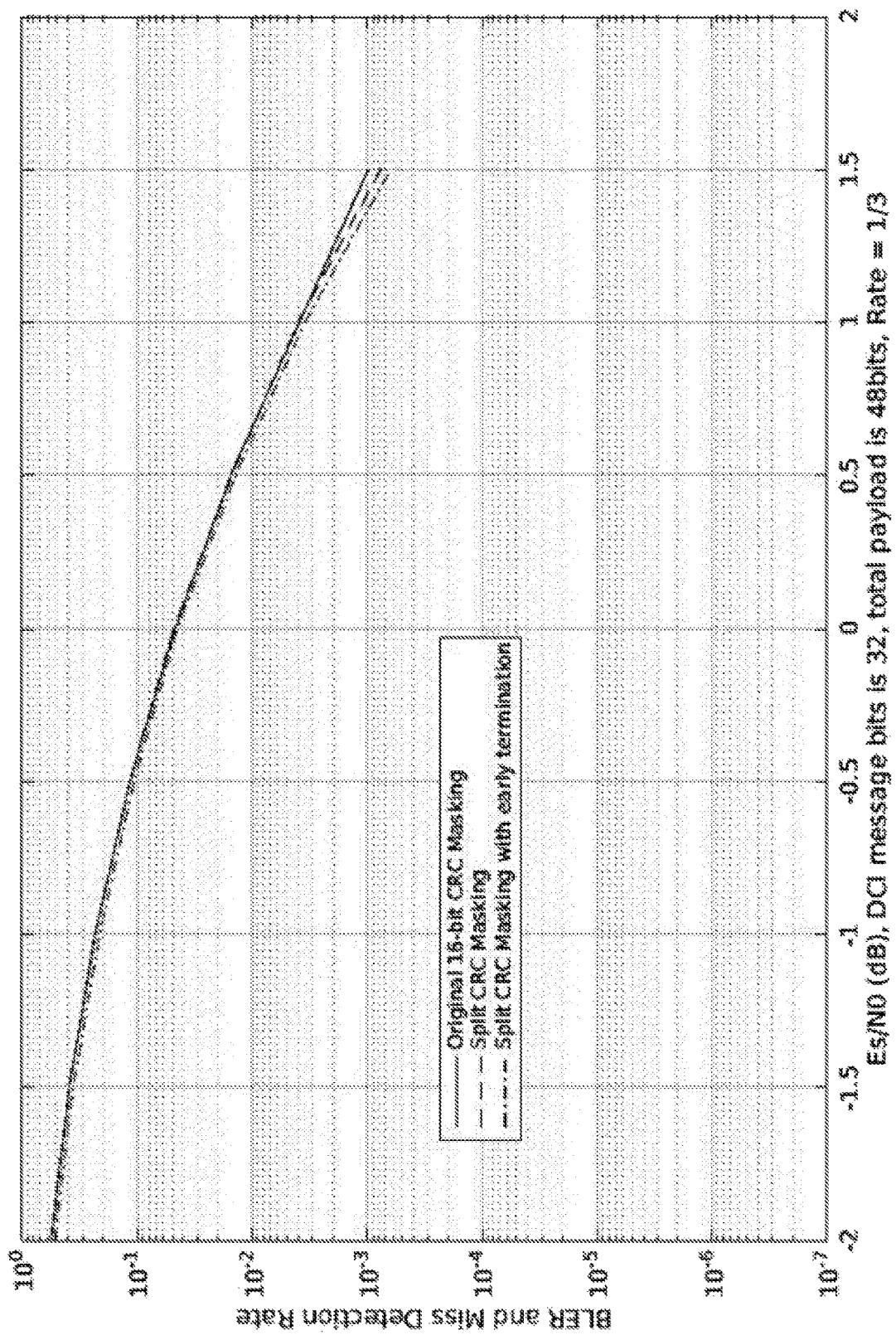
FIGS. 29 to 31 are example performance plots.

FIG. 29 is an example performance plot illustrating missing detection rate between 16-bit masked single CRC, 8-bit distributed masked CRC, and 8-bit distributed masked CRC with early termination, under the simulation conditions listed at the bottom of the plot. The plot illustrates no significant performance loss on the missing detection rate.

Figure 30:
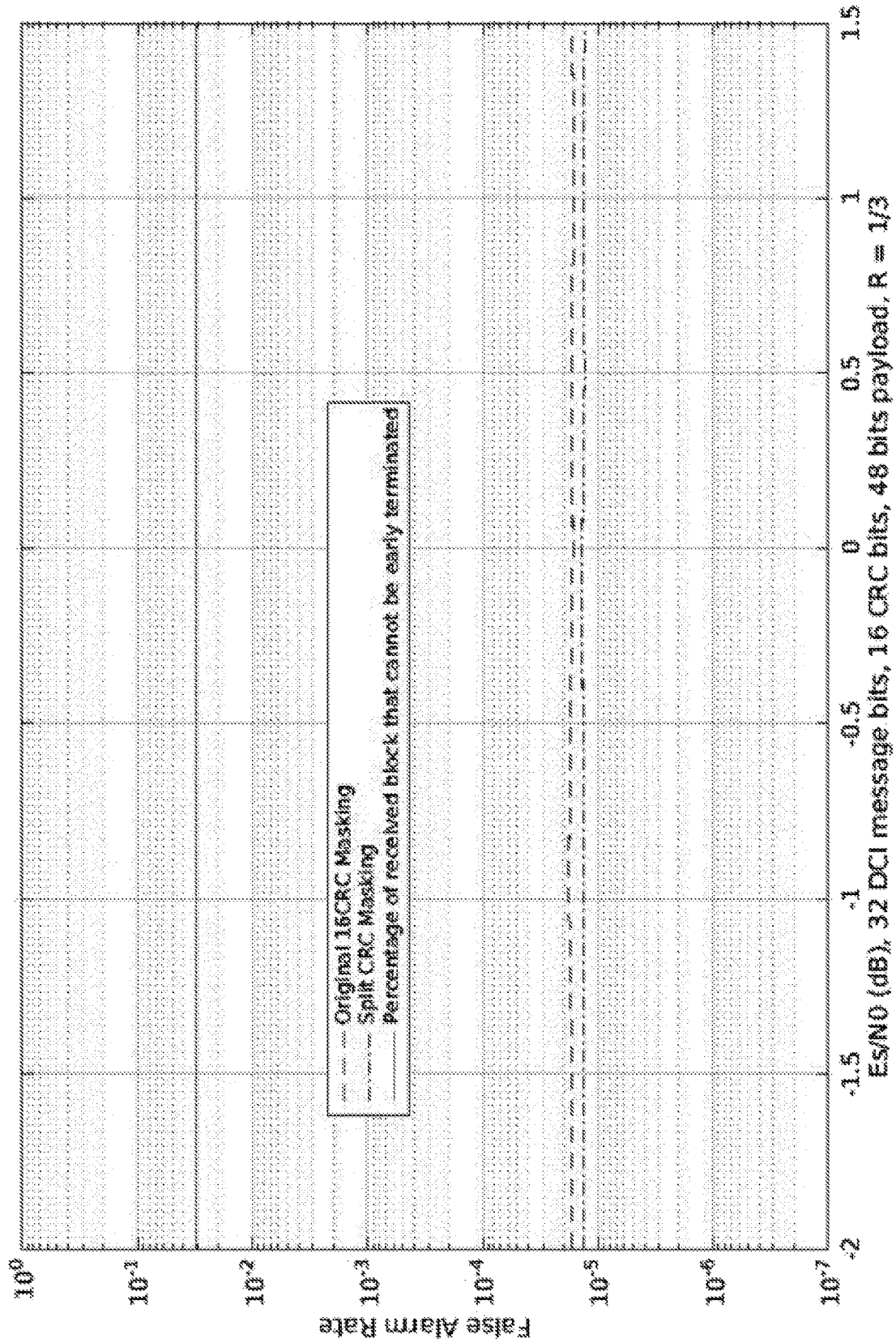

FIG. 30 is an example performance plot illustrating False-Alarm Rate (Type-1, noise signals) between 16-bit masked single CRC and 8-bit distributed masked CRC, under the simulation conditions listed at the bottom of the plot. The plot illustrates that the false-alarm rate (type-1) is improved for 16-bit masked single CRC and 8-bit distributed masked CRC. However, the plot also shows that a large percentage (over 97%) of "noisy" received blocks that cause a type 1 false alarm could be CRC "prefiltered" with early termination before the entire blocks are decoded. In the example shown, decoding for only 3% of such blocks cannot be terminated early.

Figure 31:
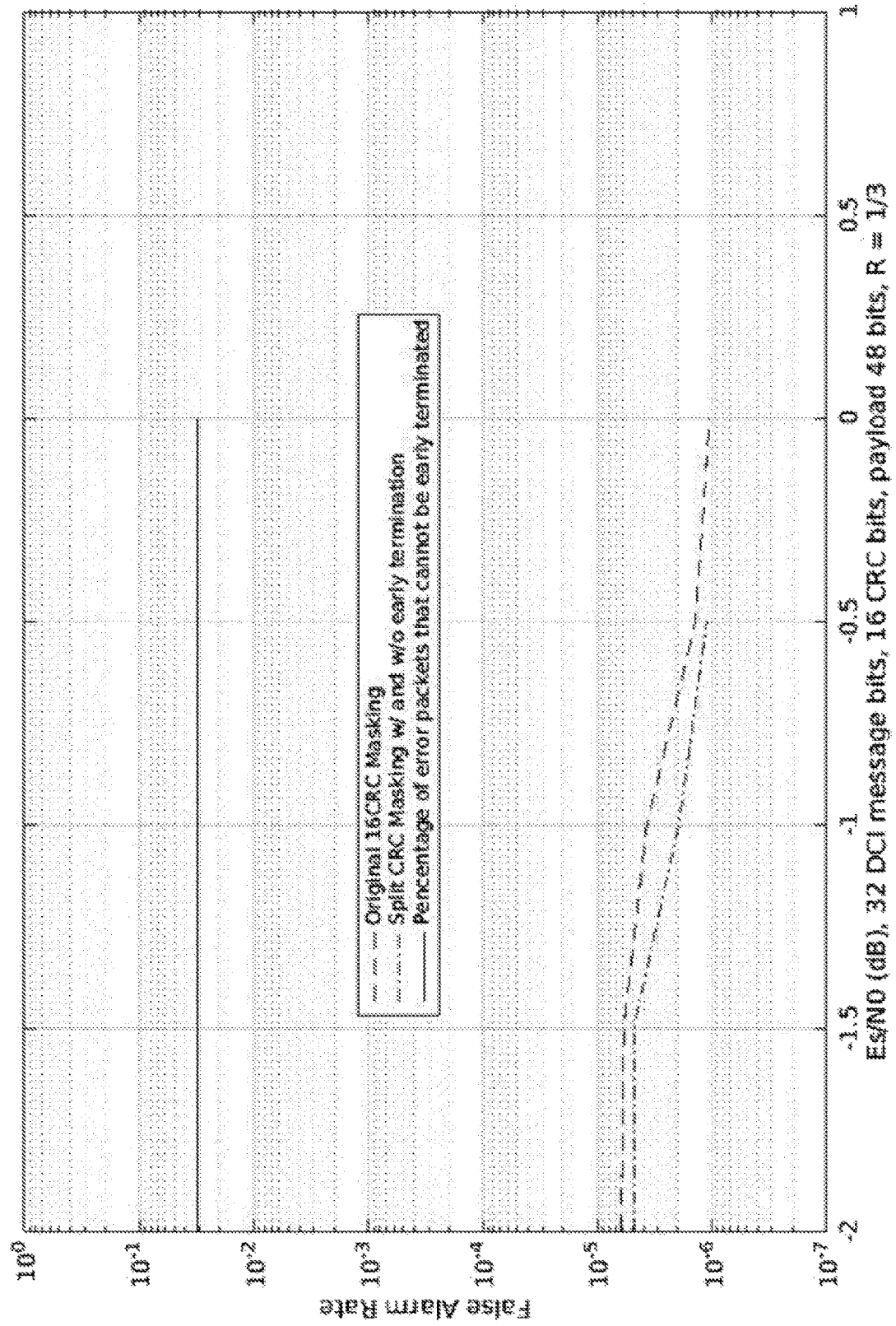

FIG. 31 is an example performance plot illustrating False-Alarm Rate (Type-2, random signals) between 16-bit masked single CRC and 8-bit distributed masked CRC, under the simulation conditions listed at the bottom of the plot. The false-alarm rate (type-2) is improved for 16-bit masked single CRC and 8-bit distributed masked CRC. FIG. 31 also shows that a large percentage (over 97%) of "random" received blocks that cause a type 2 false alarm could be CRC "prefiltered" with early termination before the entire blocks are decoded. In the example shown, decoding for only 3% of such blocks cannot be terminated early.

Based on FIGS. 29 to 31, it appears as though distributed masked CRCs could effectively reduce false alarm rate (FIGS. 30 and 31) while not significantly affecting the missing detection rate (FIG. 29).

These simulations from which the example performance plots in FIGS. 29 to 31 were derived are under the simulation conditions listed at the bottom of the plots. Similar or different results may be observed in other simulations or actual implementations.

The previous description of some embodiments is provided to enable any person skilled in the art to make or use an apparatus, method, or processor readable medium according to the present disclosure.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary and/or multi-bit symbols. Embodiments described herein could be applied to both bits and symbols, for instance.

If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

In the present disclosure, polar codes based on an Arikan 2-by-2 kernel are described solely for illustrative purposes. Embodiments may be implemented in conjunction with polar codes that are based on different kernels, and/or other types of codes that exhibit polarization. Assistant-bit based polar codes such as those disclosed in U.S. Provisional Patent Application No. 62/442,654, entitled "Apparatus and Methods for Decoding Assistant Bit-Based Polar Code Construction", filed on Jan. 5, 2017, incorporated herein by reference, and/or other types of parity check polar codes, could also or instead be used. The techniques disclosed herein could be applied to other types of polarization kernels for example, such as non-two prime number dimension kernels, non-primary dimension kernels, and/or higher dimension kernels formed by a combination of different (primary or non-primary) dimensions of kernels.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

In many of the example embodiments disclosed herein, the total number of EDC bits is the same as the total number of masking bits. For example, in one such embodiment the total number of CRC bits matches the number of bits in a UE identifier. In other embodiments, there may be more EDC bits than masking bits. Some EDCs might therefore not be masked or scrambled using masking segments. Any EDCs that are not masked or scrambled could still be used to improve decoding performance. Another possible option for embodiments in which there are more EDC bits than masking bits is to partially mask one or more EDCs using a masking segment that is shorter than the EDC, as noted above. For instance, a 3-bit masking segment could be used to mask a 5-bit CRC, in which case the 2 unmasked CRC bits could still be used for error improvement even though they are not masked. A further possible option is to use masking segments that have at least some common bits. Consider an example in which there are three 8-bit CRCs (24 CRC bits in total), but only 16 bits in a UE identifier. The UE identifier could be split into three 8-bit masking segments, such as UE identifier bits 0-7, 4-11, and 8-15, in which bits 4-7 are common to the first two masking segments and bits 8-11 are common to the last two masking segments. The UE identifier in this example could instead be split into two 8-bit masking segments and one of these two masking segments could be used more than once, to mask two of the three CRCs. Masking as disclosed herein includes these variations, in which some EDCs are not masked, at least some EDCs are partially masked or scrambled, and/or masking segments have at least some bits in common with one or more other masking segments.

The invention claimed is:

1. An apparatus comprising:
   an encoder to compute respective error-detecting codes (EDCs) based on respective segments of a block of information that is to be encoded, to distribute the respective EDCs in different locations of the block of information, to mask the respective EDCs with respective masking segments associated with a target receiver of the block of information, and to generate a codeword based on a code and an input vector that includes the block of information with the respective EDCs distributed in different locations of the block of information and masked with the respective masking segments;
   a transmitter, coupled to the encoder, to transmit the codeword to the target receiver.

2. The apparatus of claim 1, wherein the code is a polar code.

3. The apparatus of claim 1, wherein the respective EDCs are cyclic redundancy check (CRC) codes, checksum codes, or Fletcher codes.

4. The apparatus of claim 1, wherein the respective EDCs comprise a first EDC based on a first segment of the block of information and a second EDC based on the first segment, the first EDC, and a second segment of the block of information.

5. The apparatus of claim 1, wherein the respective segments comprise segments of different lengths.

6. The apparatus of claim 1, wherein the respective EDCs comprise EDCs of different lengths.

7. The apparatus of claim 1, wherein the respective masking segments are based on an identifier associated with the target receiver.

8. The apparatus of claim 7, wherein the identifier is a Radio Network Temporary Identifier (RNTI).

9. The apparatus of claim 7, wherein the respective masking segments comprise respective parts of the identifier.

10. User equipment comprising the apparatus of claim 1.

11. Communication network equipment comprising the apparatus of claim 1.

12. A method comprising:
    computing respective error-detecting codes (EDCs) based on respective segments of a block of information that is to be encoded and distributing the respective EDCs in different locations of the block of information;
    masking the respective EDCs with respective masking segments associated with a target receiver of the block of information;
    generating a codeword based on a code and an input vector that includes the block of information with the respective EDCs distributed in different locations of the block of information and masked with the respective masking segments; and
    transmitting the codeword to the target receiver.

13. The method of claim 12, wherein the code is a polar code.

14. The method of claim 12, wherein the respective EDCs are cyclic redundancy check (CRC) codes, checksum codes, or Fletcher codes.

15. The method of claim 12, wherein the respective EDCs comprise a first EDC based on a first segment of the block of information and a second EDC based on the first segment, the first EDC, and a second segment of the block of information.

16. The method of claim 12, wherein the respective segments comprise segments of different lengths.

17. The method of claim 12, wherein the respective EDCs comprise EDCs of different lengths.

18. The method of claim 12, wherein the respective masking segments are based on an identifier associated with the target receiver.

19. The method of claim 18, wherein the identifier is a Radio Network Temporary Identifier (RNTI).

20. The method of claim 18, wherein the respective masking segments comprise respective parts of the identifier.

21. A non-transitory processor-readable medium storing instructions which, when executed by one or more processors, cause the one or more processors to perform a method comprising:
   computing respective error-detecting codes (EDCs) based on respective segments of a block of information that is to be encoded and distributing the respective EDCs in different locations of the block of information;
   masking the respective EDCs with respective masking segments associated with a target receiver of the block of information;
   generating a codeword based on a code and an input vector that includes the block of information with the respective EDCs distributed in different locations of the block of information and masked with the respective masking segments; and
   transmitting the codeword to the target receiver.

* * * * *